US008703390B2

(12) United States Patent
Leenders et al.

(10) Patent No.: US 8,703,390 B2
(45) Date of Patent: *Apr. 22, 2014

(54) METHOD OF MAKING A FLEXOGRAPHIC PRINTING SLEEVE FORME

(75) Inventors: Luc Leenders, Herentals (BE); Eddie Daems, Herentals (BE)

(73) Assignee: Agfa Graphics NV, Mortsel (BE)

( * ) Notice: Subject to any disclaimer, the term of this patent is extended or adjusted under 35 U.S.C. 154(b) by 643 days.

This patent is subject to a terminal disclaimer.

(21) Appl. No.: 12/675,993

(22) PCT Filed: Sep. 5, 2008

(86) PCT No.: PCT/EP2008/061751
§ 371 (c)(1),
(2), (4) Date: Mar. 2, 2010

(87) PCT Pub. No.: WO2009/034026
PCT Pub. Date: Mar. 19, 2009

(65) Prior Publication Data
US 2010/0196827 A1 Aug. 5, 2010

Related U.S. Application Data

(60) Provisional application No. 60/971,664, filed on Sep. 12, 2007.

(30) Foreign Application Priority Data

Sep. 10, 2007 (EP) ..................... 07115995

(51) Int. Cl.
*G03F 7/00* (2006.01)
*B41N 3/00* (2006.01)

(52) U.S. Cl.
USPC .......................... 430/309; 430/306; 101/463.1

(58) Field of Classification Search
USPC ................ 430/306, 309; 101/453, 463.1, 170
See application file for complete search history.

(56) References Cited

U.S. PATENT DOCUMENTS

| 2001/0012599 | A1* | 8/2001 | Michels et al. ............. 430/273.1 |
| 2002/0025492 | A1 | 2/2002 | Murphy et al. |
| 2003/0037687 | A1* | 2/2003 | Aubanel .................... 101/382.1 |
| 2006/0054040 | A1* | 3/2006 | Daems et al. .............. 101/463.1 |

FOREIGN PATENT DOCUMENTS

| EP | 1 637 322 A2 | 3/2006 |
| EP | 1 637 926 A2 | 3/2006 |
| EP | 1637322 A2 * | 3/2006 |

OTHER PUBLICATIONS

Vanmaele et al., "Method and Device for Coating a Peripheral Surface of a Sleeve Core", U.S. Appl. No. 13/002,656, filed Jan. 5, 2011.
Official Communication issued in International Patent Application No. PCT/EP2008/061751, mailed on Dec. 4, 2008.
Leenders et al., "Device for Coating a Peripheral Surface of a Sleeve Body", U.S. Appl. No. 12/438,386, filed Feb. 23, 2009.

* cited by examiner

*Primary Examiner* — Cynthia H Kelly
*Assistant Examiner* — Connie P Johnson
(74) *Attorney, Agent, or Firm* — Keating & Bennett, LLP

(57) ABSTRACT

A method of making a flexographic printing sleeve form includes the steps of forming a sleeve body by providing one or more at least partially cured uniform layers on a sleeve carrier; forming a relief image on the sleeve body by imagewise jetting a curable jetting fluid; and optionally overall post-curing; characterized in that between formation of the sleeve body and formation of the relief image no polishing or grinding is performed.

19 Claims, 5 Drawing Sheets

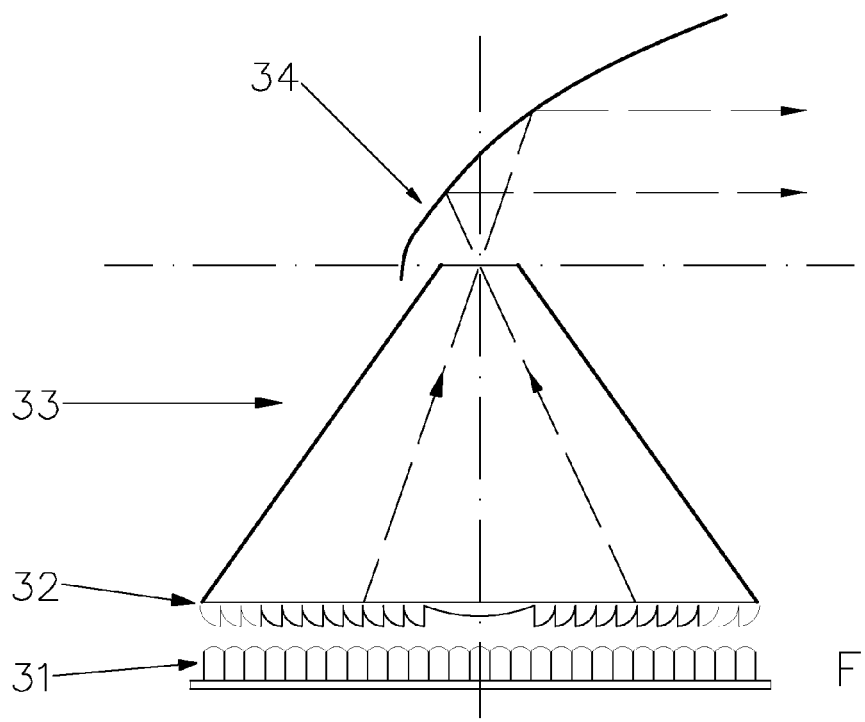
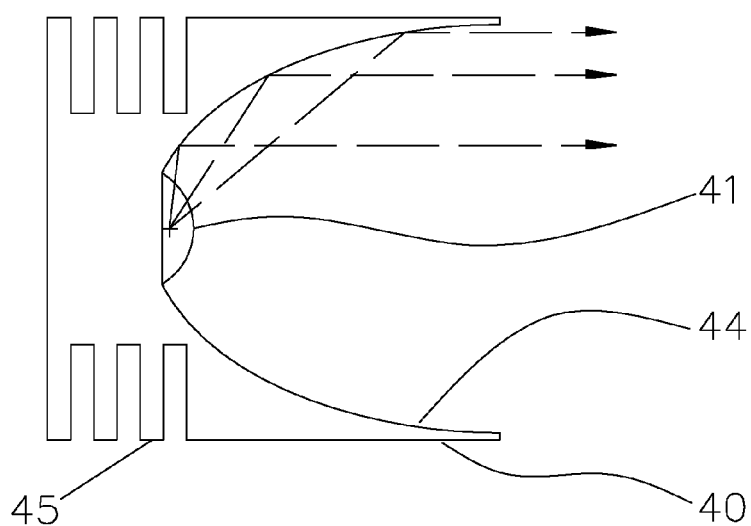

METHOD OF MAKING A FLEXOGRAPHIC PRINTING SLEEVE FORME

CROSS-REFERENCE TO RELATED APPLICATIONS

This application is a 371 National Stage Application of PCT/EP2008/061751, filed Sep. 5, 2008. This application claims the benefit of U.S. Provisional Application No. 60/971,664, filed Sep. 12, 2007, which is incorporated by reference herein in its entirety. In addition, this application claims the benefit of European Application No. 07115995.8, filed Sep. 10, 2007, which is also incorporated by reference herein in its entirety.

BACKGROUND OF THE INVENTION

1. Field of the Invention

The present invention relates to a method of making a flexographic printing sleeve forme including the steps of formation of a sleeve body by providing one or more at least partially cured uniform layers on a sleeve carrier followed by imagewise formation of a relief image on the sleeve body by inkjet printing.

2. Description of the Related Art

Flexography is today one of the most important processes for printing and commonly used for high-volume runs. Flexography is employed for printing on a variety of substrates such as paper, paperboard stock, corrugated board, films, foils and laminates. Packaging foils and grocery bags are prominent examples. Coarse surfaces and stretch films can only be economically printed with flexography, making it indeed very appropriate for packaging material printing.

Analogue flexographic printing formes are prepared from printing forme precursors including a photosensitive layer on a support or substrate. The photosensitive layer typically includes ethylenically unsaturated monomers or oligomers, a photo-initiator and an elastomeric binder. The support preferably is a polymeric foil such as PET or a thin metallic plate. Imagewise crosslinking of the photosensitive layer by exposure to ultraviolet and/or visible radiation provides a negative working printing forme precursor which after development with a suitable developer (aqueous, solvent or heat development) leaves a printing relief, which can be used for flexographic printing. Imaging of the photosensitive layer of the printing forme precursor with ultraviolet and/or visible radiation is typically carried out through a mask, which has clear and opaque regions. Crosslinking takes place in the regions of the photosensitive layer under the clear regions of the mask but does not occur in the regions of the photosensitive layer under the opaque regions of the mask. The mask is usually a photographic negative of the desired printed image. The analogue preparation of flexographic printing formes has as major disadvantages the time consuming production of a mask and the poor dimensional stability of the masks with changing environmental temperatures or humidities, making it sometimes unsatisfactory for high quality printing and colour registration. Moreover, the use of separate masks implies consumption of additional consumables and chemistry, with a negative impact on the economical and ecological aspects of the production process, which are often more a concern than the additional time required for making the masks.

Digital imaging, using laser recording, of flexographic printing forme precursors, eliminating the necessity of using a separate mask, is becoming increasingly important in the printing industry. The flexographic printing forme precursor is made laser sensitive by providing e.g. a thin, for UV and visual radiation opaque, infrared (IR) sensitive layer on top of the photopolymerizable layer. Such a flexographic printing forme precursor is typically called a "digital" or "direct-to plate" flexographic printing forme precursor. An example of such a "direct-to-plate" flexographic printing forme precursor is disclosed in EP-A 1 170 121. The thickness of the IR-ablative layer(s) is usually just a few μm. The IR-ablative layer is inscribed imagewise using an IR laser, i.e. the parts the laser beam is incident on are ablated and removed. The actual printing relief is produced in the conventional manner: exposure with actinic light (UV, visible) through the mask, the mask being imagewise opaque to the crosslinking inducing light, resulting in an imagewise crosslinking of the photopolymerizable layer, i.e. relief forming layer. Development with an organic solvent, water or heat removes the photosensitive material from the unexposed parts of the relief forming layer and the residues of the IR-ablative layer. Development may be performed using different developing steps or a single developing step. Since this method still requires a developing step, the improvement in efficiency for producing flexographic printing formes is limited.

In the direct laser engraving technique for the production of flexographic printing formes, a relief suitable for printing is engraved directly into a layer suitable for this purpose. By the action of laser radiation, layer components or their degradation products are removed in the form of hot gases, vapours, fumes, droplets or small particles and nonprinting indentations are thus produced. Engraving of rubber printing cylinders by lasers has been known since the late 60s of the last century. However, this technique has acquired broader commercial interest only in recent years with the advent of improved laser systems. The improvements in the laser systems include better focusing ability of the laser beam, higher power, multiple laser beam or laser source combinations and computer controlled beam guidance. Direct laser engraving has several advantages over the conventional production of flexographic printing plates. A number of time consuming process steps, such as the creation of a photographic negative mask or development and drying of the printing plate, can be dispensed with. Furthermore, the sidewall shape of the individual relief elements can be individually designed in the laser engraving technique.

The methods described above to prepare a flexographic printing forme are all subtractive methods, i.e. non printing areas are removed during wet or dry processing or by laser engraving. Inkjet printing provides an additive method to prepare a flexographic printing forme. For example EP-A 1 428 666 and EP-A 1 637 322 disclose a method of preparing a flexographic printing forme wherein a curable fluid is jetted on a support or substrate having an ink receiving surface. Advantages of such a method of preparing a flexographic printing forme are the absence of any processing steps and the consumption of no more material as necessary to form a suitable relief image (i.e. removal of non printing areas is no longer required).

Conventional flexographic printing formes are "flat" plates. There are however particular applications requiring the use of continuous cylindrical formes, the latter typically referred to as sleeves. These sleeves, in particular seamless sleeves, enable continuous printing and provide improved registration accuracy and shorter change-over-times on press. Furthermore, such sleeves may be well-suited for mounting on laser exposure equipment, where it can replace the drum or be mounted on the drum for exposure by a laser. Continuous printing has applications in the flexographic printing of continuous designs in wallpaper, decoration, gift wrapping paper and packaging.

Sleeves or sleeve bodies are typically made by coating or mold casting an elastomeric layer onto a polymeric or metallic cylinder, a so called basic sleeve, raw sleeve or sleeve carrier. To obtain a uniform surface of the sleeve body, grinding and/or polishing of the sleeve body is necessary to obtain good printing results.

In the present application a sleeve body is a sleeve carrier provided with one or more at least partially cured layers. A sleeve forme is obtained upon forming a relief image on the sleeve body.

A disadvantage of an inkjet method for preparing flexographic printing sleeve formes by jetting the relief image directly onto the sleeve carrier, may be (i) a poor adhesion of the relief image, possibly resulting in a poor runlength and (ii) removal of the relief image after printing, e.g. by mechanical grinding, to reuse the sleeve carrier, becomes difficult without damaging the substrate. The latter, removal of the relief image, is especially important when sleeves are used, since sleeves are expensive.

Applying both a so-called "elastomeric floor" layer on the sleeve carrier in a thickness of typically between 100 µm and several millimeters and the relief parts with an inkjet method, to avoid the two mentioned disadvantages, would be very time consuming.

As an alternative to build the "elastomeric floor", a typical photopolymer sleeve may be used. Such a photopolymer sleeve typically includes a sleeve carrier and at least one photocurable layer. Typically, when using "digital" imaging to prepare the printing formes, as described above, the "elastomeric floor" layer is established by an overall exposure through the backside of the support while the relief image is realized by imagewise exposure through a mask layer. In an inkjet method, one could cure the complete layer of the photopolymer sleeve, followed by forming the relief image on the completely cured photolayer by inkjet, as suggested in EP-A 1 637 322. However, since the photolayer of a typical photopolymer sleeve is intended to form both the "floor" layer and the relief layer, the "floor" layer realized in this method would be too thick.

It would be advantageous to provide sleeve bodies, including one or more at least partially cured layers, specifically designed to enable a relief image to be formed on it by an inkjet method.

To avoid large stocks of different sleeve bodies, and to enable a high flexibility in choosing the optimum "elastomeric floor" in view of the relief image to be built upon it by inkjet, a method wherein the sleeve body is prepared by applying one or more at least partially cured layers, followed by forming the relief image on it by inkjet, without the need to polish and/or grind the sleeve body, would be highly advantageous. Moreover, it would be particularly advantageous if both providing the sleeve carrier with a dedicated "elastomeric floor" and forming the relief image by inkjet can be performed close to the press, to ensure short access times.

The unpublished EP-A 06 120 823 (filed 18, Sep. 2006) discloses a coating device, with limited floor space requirements and supporting a wide range of sleeve carriers, capable of coating a single or a multitude of uniform layers of direct laser engraveable material, without the need for a grinding and/or polishing step.

SUMMARY OF THE INVENTION

Preferred embodiments of the present invention provide a method of preparing flexographic printing sleeve formes, supporting a wide range of sleeve carriers, having a short access time, having a high flexibility with regard to the materials used and which may be performed "next to the printing press". Another preferred embodiment of the invention achieves flexographic printing formes having excellent printing properties, e.g. good adhesion of the relief image to the "elastomeric floor", resulting in high run lengths.

The above described preferred embodiments of the present invention are realized by a method having the specific features as set out below. Further advantageous embodiments of the invention are also set out below.

Other elements, features, steps, characteristics and advantages of the present invention will become more apparent from the following detailed description of the preferred embodiments with reference to the attached drawings.

BRIEF DESCRIPTION OF THE DRAWINGS

FIG. 3 shows a cross-sectional view of an embodiment of an annular irradiation stage.

FIG. 4 shows a cross-sectional view of another embodiment of an annular irradiation stage.

DETAILED DESCRIPTION OF THE PREFERRED EMBODIMENTS

Figure 1:
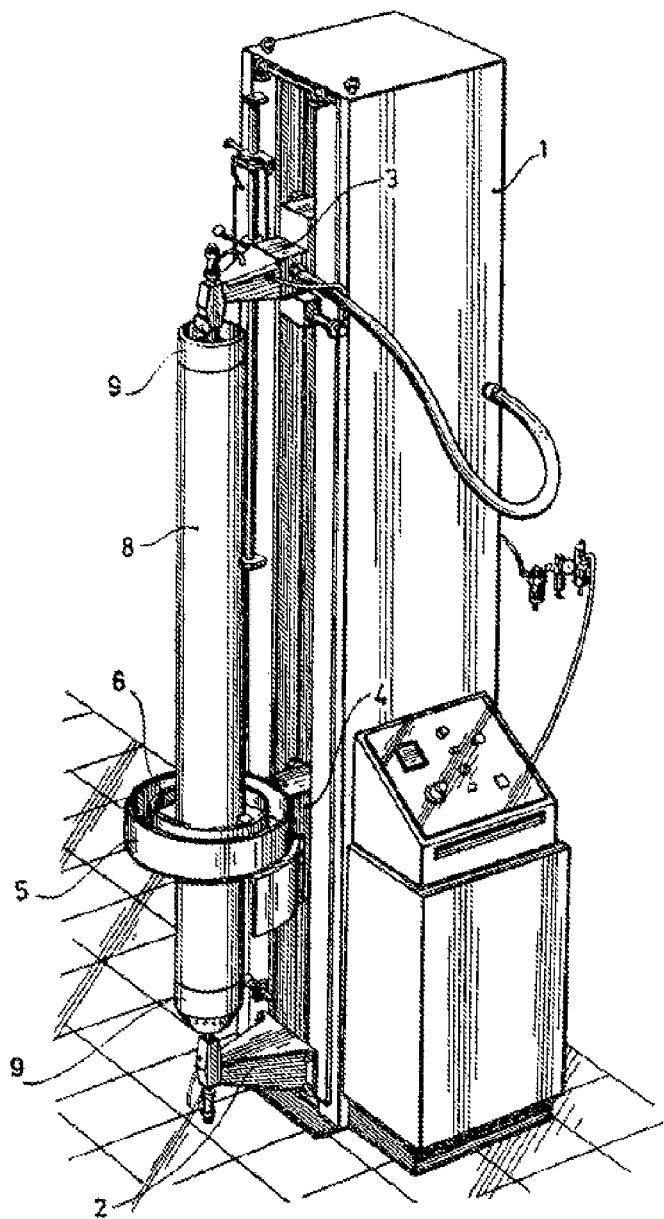
FIG. 1 shows a vertical ring coater known from the prior art.

The present invention relates to a method of making a flexographic printing sleeve including the steps of:
(i) formation of a sleeve body by providing one or more at least partially cured uniform layers on a sleeve carrier;
(ii) formation of a relief image on the sleeve body by imagewise jetting a curable jetting fluid;
(iii) optionally overall post-curing;
characterized in that between formation of the sleeve body and formation of the relief image no polishing or grinding is performed.

In the method according to a preferred embodiment of the present invention a sleeve carrier is provided with one or more at least partially cured uniform layers. The term uniform refers to surface properties, evenness, smoothness, homogeneity, coating formulation, etc. of the layers. Providing uniform layers eliminates the need for grinding and/or polishing before formation of the relief image. Eliminating the grinding and/or polishing steps shortens the time to prepare the flexographic sleeve. Moreover, no additional apparatuses, including a device to remove the "polymer dust" formed during grinding and polishing, are needed in the method of the present preferred embodiment.

To obtain optimum quality prints, to avoid excessive wear of the relief image during printing resulting in a poor runlength, it is very important that the sleeve body has a perfect cylindrical shape. A parameter often used in the flexographic art, reflecting the quality of the cylindrical shape, is the Total Indicator Runout value, also referred to as TIR value. Runout refers to the result obtained of placing the cylinder on a spindle and rotating the cylinder about its central axis while measuring with a dial indicator its surface deviation from perfect roundness. Total Indicator Runout refers to such a measurement along the length of the cylinder. More information on the Total Indicator Runout parameter used in the flexographic industry and on methods to measure the TIR value of a cylinder can be found in FLEXO® Magazine, February 2002 and "Flexography: Principles & Practices, $5^{th}$ edition, Volume 6, page 128-143. Flexographic sleeve bodies are characterized by a TIR value of typically 25 µm or less. These values are obtained by grinding and/or polishing the sleeve body after applying the elastomeric layers on the sleeve carrier. In a preferred embodiment of the present invention, a sleeve body is provided, preferably by coating, more preferably by vertical coating, on a sleeve carrier, one or more at least partially cured layers. The TIR value of the sleeve body amounts to preferably 100 µm or less, more preferably of 50 µm or less, without performing any additional manipulation, such as grinding and/or polishing.

Composition of the Uniform Layers

One or more curable compositions are applied onto a sleeve carrier, forming the one or more uniform layers. If more than one curable layer is formed, the layers may have the same or, more preferably, a different composition. For example the layer nearest to the sleeve carrier may be optimized towards an optimal adhesion between the "elastomeric floor" and the sleeve carrier, while the layer, on which the relief image will be jetted, may be optimized towards optimal adhesion between the relief image and the "elastomeric floor".

The uniform layers are preferably polymerizable layers, which may be cured by exposure to actinic or IR radiation or by electron beam radiation. Curing may also be performed by applying heat to the coated layers. Most preferably, the polymerizable layers may be cured by exposure to UV light. Curing may be the result of crosslinking of polymers, of polymerization of monomers and/or oligomers, or of both.

Initiators

The polymerizable layers according to a preferred embodiment of the present invention may include one or more initiator(s). The initiator typically initiates the polymerization reaction. The initiator may be a thermal initiator, but is preferably a photo-initiator.

Thermal initiator(s) suitable for use in the curable resin composition include tert-amyl peroxybenzoate, 4,4-azobis (4-cyanovaleric acid), 1,1'-azobis(cyclohexanecarbonitrile), 2,2'-azobisisobutyronitrile (AIBN), benzoyl peroxide, 2,2-bis(tert-butylperoxy)butane, 1,1-bis(tert-butylperoxy)cyclohexane, 1,1-Bis(tert-butylperoxy)cyclohexane, 2,5-bis(tert-butylperoxy)-2,5-dimethylhexane, 2,5-bis(tert-butylperoxy)-2,5-dimethyl-3-hexyne, bis(1-(tert-butylperoxy)-1-methylethyl)benzene, 1,1-bis(tert-butylperoxy)-3,3,5-trimethylcyclohexane, tert-butyl hydroperoxide, tert-butyl peracetate, tert-butyl peroxide, tert-butyl peroxy benzoate, tert-butylperoxy isopropyl carbonate, cumene hydro peroxide, cyclohexanone peroxide, dicumyl peroxide, lauroyl peroxide, 2,4-pentanedione peroxide, peracetic acid and potassium persulfate.

A photo-initiator produces initiating species, preferably free radicals, upon absorption of actinic radiation. A photo-initiator system may also be used. In the photo-initiator system, a photo-initiator becomes activated upon absorption of actinic radiation and forms free radicals by hydrogen or electron abstraction from a second compound. The second compound, usually called the co-initiator, becomes then the initiating free radical. Free radicals are high-energy species inducing polymerization of monomers or oligomers. When polyfunctional monomers and oligomers are present in the curable resin composition, the free radicals can also induce crosslinking.

Curing may be realized by more than one type of radiation with different wavelength. In such cases it may be preferred to use more than one type of photo-initiator together.

A combination of different types of initiators, for example, a photo-initiator and a thermal initiator may also be used.

Suitable photo-initiators are disclosed in e.g. J. V. Crivello et al. in "Photoinitiators for Free Radical, Cationic & Anionic Photopolymerisation $2^{nd}$ edition", Volume III of the Wiley/SITA Series In Surface Coatings Tecnology, edited by G. Bradley and published in 1998 by John Wiley and Sons Ltd London, pages 276 to 294.

Specific examples of photo-initiators may include, but are not limited to, the following compounds or combinations thereof: quinones, benzophenone and substituted benzophenones, hydroxy alkyl phenyl acetophenones, dialkoxy acetophenones, α-halogeno-acetophenones, aryl ketones such as 1-hydroxycyclohexyl phenyl ketone, 2-hydroxy-2-methyl-1-phenyl propan-1-one, 2-benzyl-2-dimethylamino-(4-morpholinophenyl)butan-1-one, thioxanthones such as isopropylthioxanthone, benzil dimethylketal, bis(2,6-dimethyl benzoyl)-2,4,4-trimethylpentylphosphine oxide, trimethylbenzoyl phosphine oxide derivatives such as 2,4,6 trimethylbenzoyl diphenylphosphine oxide, methyl thio phenyl morpholine ketones such as 2-methyl-1-[4-(methylthio)phenyl]-2-morpholinopropan-1-one, morpholino phenyl amino ketones, 2,2-dimethoxy-1,2-diphenylethan-1-one, 5,7-di-iodo-3-butoxy-6-fluorone, diphenyliodonium fluoride and triphenylsulfonium hexafluophosphate, benzoin ethers, peroxides, biimidazoles, aminoketones, benzoyl oxime esters, camphorquinones, ketocoumarins and Michler's ketone.

Suitable commercial photo-initiators include IRGACURE 127, IRGACURE 184, IRGACURE 500, IRGACURE 907, IRGACURE 369, IRGACURE 1700, IRGACURE 651, IRGACURE 819, IRGACURE 1000, IRGACURE 1300, IRGACURE 1800, IRGACURE 1870, DAROCUR 1173, DAROCUR 2959, DAROCUR 4265 and DAROCUR ITX available from CIBA SPECIALTY CHEMICALS, LUCERIN TPO available from BASF AG, ESACURE KK, ESACURE KT046, ESACURE KT055, ESACURE KIP150, ESACURE KT37 and ESACURE EDB available from LAMBERTI, H-Nu 470 and H-Nu 470X available from SPECTRA GROUP Ltd., GENOCURE EHA and GENOCURE EPD from RAHN.

Since curing is preferably realized with UV-radiation, the preferred photo-initiators absorb UV radiation.

To improve in depth curing, it may be advantageous to use an initiator system that decreases in UV absorbance as polymerization proceeds, as disclosed in US2002/0123003 paragraph [0021].

Particular preferred photo-initiators are IRGACURE 651 and IRGACURE 127.

Suitable cationic photo-initiators include compounds, which form aprotic acids or Bronstead acids upon exposure sufficient to initiate polymerization. The photo-initiator used may be a single compound, a mixture of two or more active compounds, or a combination of two or more different compounds, i.e. co-initiators. Non-limiting examples of suitable cationic photo-initiators are aryldiazonium salts, diaryliodonium salts, triarylsulphonium salts, triarylselenonium salts and the like.

Sensitizing agents may also be used in combination with the initiators described above. In general, sensitizing agents absorb radiation at a wavelength different then the photo-initiator and are capable of transferring the absorbed energy to that initiator, resulting in the formation of e.g. free radicals.

The amount of initiator in the curable composition of the present invention is preferably from 1 to 10% by weight, more preferably from 2 to 8% by weight, relative to the total weight of the ingredients of the polymerizable layers.

Curable Compounds

The polymerizable layers includes one or more curable compounds. These curable compounds may include one or more polymerizable groups, preferably radically polymerizable groups.

Any polymerizable mono- or oligofunctional monomer or oligomer commonly known in the art may be employed. Preferred monofunctional monomers are described in EP-A 1 637 322 paragraph [0054] to [0057]. Preferred oligofunctional monomers or oligomers are described in EP-A 1 637 322 paragraphs [0059] to [0064].

The selection of curable compounds determines the properties of the cured resin composition, e.g. flexibility, resilience, hardness, adhesion of the relief image.

A particularly preferred curable compound is an urethane (meth)acrylate oligomer. It has been found that the presence of urethane(meth)acrylate oligomers, preferably in an amount of 40% by weight or more, relative to the total weight of the ingredients of the polymerizable layers, provides excellent printing properties to the flexographic sleeves. The urethane(meth)acrylate oligomer may have one, two, three or more polymerizable groups. Preferably the urethane(meth) acrylate oligomers have one or two polymerizable groups.

Commercially available urethane(meth)acrylates are e.g. CN9170, CN910A70, CN966H90, CN962, CN965, CN9290 and CN981 from SARTOMER; BR-3741B, BR-403, BR-7432, BR-7432G, BR-3042, BR-3071 from BOMAR SPECIALTIES CO.; NK Oligo U-15HA from SHIN-NAKAMURA CHEMICAL CO. Ltd.; ACTILANE 200, ACTILANE SP061, ACTILANE 276, ACTILANE SP063 from AKZO-NOBEL; EBECRYL 8462, EBECRYL 270, EBECRYL 8200, EBECRYL 285, EBECRYL 4858, EBECRYL 210, EBECRYL 220, EBECRYL 1039, EBECRYL 1259 and IRR160 from CYTEC; GENOMER 1122 and GENOMER 4215 from RAHN A.G. and VERBATIM HR50 an urethane acrylate containing liquid photopolymer from CHEMENCE.

Preferably, the polymerizable layers include also a silicone acrylate compound, such as e.g. EBECRYL 1360.

To optimize the viscosity of the curable composition forming the polymerizable layers, one or more mono and/or bifunctional monomers and/or oligomers are used as diluents. Preferred monomers and/or oligomers acting as diluents are miscible with the above described urethane(meth)acrylate oligomers. Particularly preferred monomers and/or oligomers acting as diluents do not adversely affect the properties of the cured resin composition.

The monomer(s) or oligomer(s) used as diluents are preferably low viscosity acrylate monomer(s).

Particularly preferred monomers and/or oligomers acting as diluents in the curable resin composition of the present invention are: SR344, a polyethyleneglycol (400) diacrylate; SR604, a polypropylene monoacrylate; SR9003, a popoxylated neopentyl glycol diacrylate; SR610, a polyethyleneglycol (600) diacrylate; SR531, a cyclic trimethylolpropane formal acrylate; SR340, a 2-phenoxyethyl methacrylate; SR506D, an isobornyl acrylate; SR285, a tetrahydrofurfuryl acrylate all from SARTOMER or CRAY VALLEY; MIRAMER M100, a dicaprolactone acrylate and GENOMER 1122, a monofunctional urethane acrylate from RAHN; BISOMER PEA6, a polyethyleneglycol monoacrylate from COGNIS; EBECRYL 1039, a very low viscous urethane monoacrylate; EBECRYL 11, a polyethylene glycol diacrylate; EBECRYL 168, an acid modified methacrylate, EBECRYL 770, an acid functional polyester acrylate diluted with 40% hydroxyethylmethacrylate from UCB and CN137, a low viscosity aromatic acrylate oligomer from CRAYNOR.

Inhibitors

In order to prevent premature thermal polymerization, the polymerizable layers may contain a polymerization inhibitor. Suitable polymerization inhibitors include phenol type antioxidants, hindered amine light stabilizers, phosphor type antioxidants, hydroquinone monomethyl ether, hydroquinone, t-butyl-catechol or pyrogallol.

Suitable commercial inhibitors are, for example, SUMILIZER GA-80, SUMILIZER GM and SUMILIZER GS produced by Sumitomo Chemical Co. Ltd.; GENORAD 16, GENORAD 18 and GENORAD 20 from Rahn AG; IRGASTAB UV10 and IRGASTAB UV22, TINUVIN 460 and CGS20 from Ciba Specialty Chemicals; FLOORSTAB UV range (UV-1, UV-2, UV-5 and UV-8) from Kromachem Ltd, Additol S range (S100, S110, S120 and S130) from Cytec Surface Specialties.

Since excessive addition of these polymerization inhibitors will lower the curing efficiency, the amount is preferably lower than 2% by weight relative to the total weight of the ingredients of the polymerizable layers.

Elastomers

To further optimize the properties of the flexographic printing forme precursor the polymerizable layers may further include one or more elastomeric compounds. Suitable elastomeric compounds include copolymers of butadiene and styrene, copolymers of isoprene and styrene, styrene-diene-styrene triblock copolymers, polybutadiene, polyisoprene, nitrile elastomers, polyisobutylene and other butyl elastomers, polyalkyleneoxides, polyphosphazenes, elastomeric polyurethanes and polyesters, elastomeric polymers and copolymers of (meth)acrylates, elastomeric polymers and copolymers of olefins, elastomeric copolymers of vinylacetate and its partially hydrogenated derivatives.

The type and amount of monomers and/or oligomers and optionally the elastomeric compounds are selected to realize optimal properties of the printing forme precursor such as flexibility, resilience, hardness, adhesion to the substrate and adhesion of the relief image. It may be advantageous that the curable composition forming the outermost layer of the "elastomeric floor" includes ingredients compatible with those of curable compositions used to form the relief image by inkjet, to optimize the adhesion between the relief image and the "elastomeric floor".

Plasticizers

Plasticizers are typically used to improve the plasticity or to reduce the hardness of the flexographic printing forme precursor. Plasticizers are liquid or solid, generally inert organic substances of low vapor pressure.

Suitable plasticizers include modified and unmodified natural oils and resins, alkyl, alkenyl, arylalkyl or arylalkenyl esters of acids, such as alkanoic acids, arylcarboxylic acids or phosphoric acid; synthetic oligomers or resins such as oligostyrene, oligomeric styrene-butadiene copolymers, oligomeric α-methylstyrene-p-methylstyrene copolymers, liquid oligobutadienes, or liquid oligomeric acrylonitrile-butadiene copolymers; and also polyterpenes, polyacrylates, polyesters or polyurethanes, polyethylene, ethylene-propylene-diene rubbers, α-methyloligo (ethylene oxide), aliphatic hydrocarbon oils, e.g., naphthenic and paraffinic oils; liquid polydienes and liquid polyisoprene.

Examples of particularly suitable plasticizers are paraffinic mineral oils; esters of dicarboxylic acids, such as dioctyl adipate or dioctyl terephthalate; naphthenic plasticizers or polybutadienes having a molar weight of between 500 and 5,000 g/mol.

More particularly preferred plasticizers are HORDAFLEX LC50 available from HOECHST, Santicizer 278 available from MONSANTO, TMPME available from PERSTORP AB, and PLASTHALL 4141 available from C. P. Hall Co.

It is also possible to use a mixture of different plasticizers.

Preferred plasticizers are liquids having molecular weights of less than 5,000, but can have molecular weights up to 30,000.

Other Additives

The polymerizable layers may further include other additives such as dyes, pigments, photochromic additives, antioxidants, antiozonants and tack-reducing additives. Examples of tack-reducing additives are for example aromatic carboxylic acids, aromatic carboxylic acid esters, polyunsaturated carboxylic acids, polyunsaturated carboxylic acid esters of mixtures thereof. The amount of additives is preferably less than 20% by weight based on the sum of all constituents of the photopolymerizable composition, and is advantageously chosen so that the overall amount of plasticizer and additives does not exceed 50% by weight based on the sum of all the constituents.

Liquid Photopolymers

Commercially available liquid photopolymers, e.g. VERBATIM liquid photopolymer resins from CHEMENCE, can be used to prepare the "elastomeric floor". A wide range of liquid photopolymer products are available, each product resulting upon coating and curing in layers having particular properties, e.g. different Shore A hardnesses. When the "elastomeric floor" is formed by more then one layer, different liquid photopolymers may be used in each different layer. The curable compositions used to form the uniform layers onto the sleeve carrier may consist essentially of such a commercially available liquid photopolymer and a photo-initiator, such as e.g. IRGACURE 127. Preferably, these liquid photopolymers are used in combination with the diluent monomers and/or oligomers described above to optimize the viscosity of the curable composition.

Thickness of the Uniform Layers

The total thickness of the polymerizable layers may be chosen by the skilled worker in accordance with the requirements of the desired application. The total thickness may vary from 0.2 to 3.0 mm, more preferably from 0.3 to 1.5 mm, most preferably from 0.4 to 1.2 mm. Compared to conventional photopolymerizable layers applied on sleeves, to be used in conventional flexographic sleeve formation whereby both the "elastomeric floor" and the relief image is formed by the polymerizable layers, the uniform layer(s) according to the present preferred embodiment have a lower thickness because the layers are only used to form the "elastomeric floor".

The "elastomeric floor" has preferably a Shore A hardness of from 30 to 80.

Curing of the Uniform Layers

After providing the polymerizable layers on a sleeve carrier, the layer(s) are cured by irradiation or heat.

Heat may be used to cure (i.e. polymerize) when the composition(s) includes a thermal initiator, as described above.

Irradiation may be electron beam irradiation or actinic irradiation, preferably actinic irradiation. Curing with electron beam irradiation does not necessitate the presence of an initiator in the curable composition(s). The suitability of a particular actinic radiation source is governed by the photosensitivity of the initiator used in preparing the flexographic printing forme precursor. The preferred photosensitivity of most common flexographic printing forme precursors is in the UV and deep UV region of the spectrum.

Examples of suitable radiation sources include carbon arcs, mercury-vapor arcs, fluorescent lamps, electron flash units, electron beam units, lasers, LEDs and photographic flood lamps. Preferred sources of UV radiation are the mercury vapor lamps.

UV radiation is generally classified as UV-A, UV-B and UV-C as follows:
UV-A: 400 nm to 320 nm
UV-B: 320 nm to 290 nm
UV-C: 290 nm to 100 nm It may be advantageous to use two radiation sources to perform the curing. For example, the first UV source may be selected to be an UV-A or UV-C radiation source while the second UV source may be selected to be an UV-A or UV-C radiation source. The second curing step is often referred to as a post curing step. Typically first an UV-A curing is performed, followed by a UV-C post-curing, to obtain non-tacky surfaces.

However, in the method of preparing a flexographic sleeve according to a preferred embodiment of the present invention, it has been observed that a partially cured uniform layer, for example obtained by a short UV-A curing without performing a UV-C curing, may result in an improved adhesion with the relief image jetted on it. A possible explanation may be the presence of unreacted monomers in the partially cured uniform layer, which may cure together with the monomers of the jetted relief image, upon overall curing.

When more than one layer of curable compositions are provided on a substrate, curing may be performed after providing all of the layers on the substrate or curing may be performed after each layer has been provided on the substrate. When more or more layers are present, partially curing the outermost layer may be beneficial towards the adhesion of the relief image on it.

The curing time will vary depending on the intensity and spectral energy distribution of the radiation, the distance between the light source and the printing element, the composition and thickness of the curable composition(s) of the printing forme precursor.

A removable coversheet may be present during curing, to minimize the inhibition of the polymerization by oxygen. Another method to minimize the inhibition by oxygen is performing the curing under inert $N_2$ or $CO_2$ atmosphere.

Any method may be used to form a sleeve body by applying one or more at least partially cured uniform layers on a sleeve carrier, with the proviso that no grinding and/or polishing step is needed before forming the relief image by inkjet on the sleeve body.

Vertical Coating Device

A particularly preferred method for applying one or more at least partially cured layers on a sleeve carrier is disclosed in the unpublished EP-A 06 120 823 (filed 18, Sep. 2006). EP-A 06 120 823 discloses a "vertical" coating device that supports a wide range of sleeve carriers, and is capable of coating a single or a multitude of "uniform" layer(s) of curable material onto a sleeve carrier, with a coating layer thickness variable between several micrometers and several millimeters. The uniformity of the coated layer(s) is provided through at least partial curing of the layer(s) immediately after or almost simultaneously with coating.

Because one application of a preferred embodiment of the present invention is the coating of an UV-curable material onto a sleeve carrier, the discussion below will often refer to UV-curable coating liquids, UV-LED's, etc. to illustrate the present invention. However, it should be understood that the present invention is not limited to UV light or UV photocuring technologies. Electron beam radiation, IR radiation or heat may also be used to at least partially cure the one or more layers provided on the sleeve carrier or core.

Preferred embodiments of the invention may be engrafted on any equipment suitable for positioning a sleeve carrier in a vertical position and having a tool smoothly moveable along the sleeve carrier in the vertical direction. Examples of such equipment are vertical ring coaters described in the prior art or commercially available from Max Daetwyler Corporation (Switzerland), the Stork Prints Group (The Netherlands), and others. The description of the present invention will therefore not elaborate on the basic features of this type of equipment. Only in summary, a vertical ring coater as shown in FIG. 1 may include a vertical support column 1 that supports the sleeve carrier 8 in a vertical position, incorporates a mechanism 4 for lifting and lowering a coating carriage 5 vertically along the sleeve carrier 8, and provides a space envelope for integrating a number of utilities such as power cabling etc. The coating carriage 5 supports a coating collar 6 that is filled with a coating liquid for coating onto the sleeve carrier 8. The sleeve carrier 8 is mounted in the vertical position by flanges or mounting heads 9 at both ends; the flanges or mounting heads 9 themselves are supported on the vertical support column 1. The flanges or mounting heads 9 may be shaped so as to provide a smooth extension of the sleeve carrier's peripheral surface, thereby allowing coating of the sleeve carrier 8 up to edges and also providing a sealed home position for the annular coating collar 6 at one of the flanges or mounting heads 9. The sleeve carrier 8 may be coated during an upward or downward movement of the coating collar 6.

When the coating collar 6 moves downwards during the coating process, the coating layer is created from the meniscus between the liquid surface of the coating liquid contained in the coating collar 6, and the peripheral surface of the sleeve carrier 8. In general, the thickness of the coating layer applied with this type of immersion coating technique is determined by the formula $$d = 20 * \sqrt{\frac{\eta * v}{f}} \quad \text{(Eq. 1)}$$

wherein d equals the thickness of the coated layer in µm, $\eta$ is the viscosity of the coating liquid in mPa·s, v is the coating velocity in m·min$^{-1}$, and f is the specific density in kg/liter.

Annular Irradiation Stage

Figure 2:
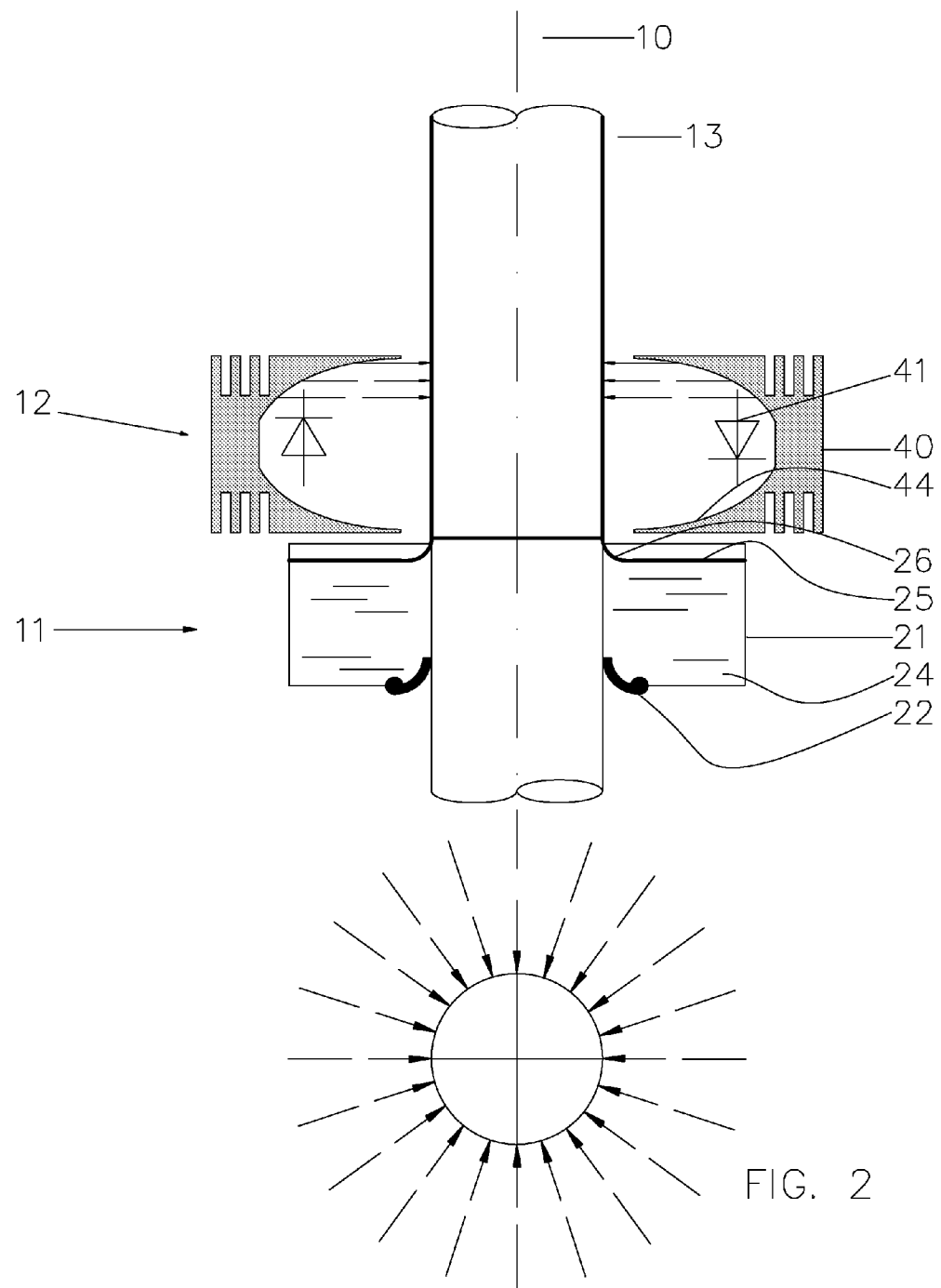
FIG. 2 shows a preferred embodiment of the invention incorporating an annular irradiation stage.

A preferred embodiment of the invention is now described in detail, with reference to FIG. 2. The coating collar 21 in FIG. 2 includes an annular squeegee 22 providing a slideable seal between the bottom of the coating collar 21 and the sleeve carrier 13, in order to prevent a coating liquid 24 contained in the coating collar 21 to leak from the coating collar 21. The coating collar 21 is open at the top. The liquid surface 25 of the coating liquid 24 contained in the coating collar 21 forms an annular meniscus 26 with the peripheral surface of the sleeve carrier 13. The coating collar 21 may be supported by a coating carriage (e.g. coating carriage 5 in FIG. 1) that is connected to a lifting and lowering mechanism (e.g. lift mechanism 4 in FIG. 1) incorporated in a vertical support column (e.g. column 1 in FIG. 1). These features have been omitted in FIG. 2. The lifting and lowering mechanism can move the entire coating stage 11, i.e. the assembly of the coating carriage with the coating collar, up and down along a vertical axis. When a sleeve carrier 13 is mounted, the lifting and lowering mechanism is capable of moving the annular coating stage 11 along the peripheral surface of the sleeve carrier 13, providing a coating meniscus 26 at the top and a sealing contact at the bottom of the coating collar 21. The coating axis 10 refers to the vertical axis through the centre of the coating collar 21 and coinciding with the axis of the sleeve carrier 13 when mounted on the coating device. The coating collar 21 moves up and down, centred around the coating axis 10.

On top of the annular coating stage 11, an annular irradiation stage 12 is mounted. The purpose of the irradiation stage 12 is to set the coated layer, just applied by the annular coating collar 21, and prevent the coating liquid from running down. Running down of the coated layer decreases the layer thickness at upper locations and increases the layer thickness at lower locations along the sleeve carrier 13, and decreases the topographic uniformity of the layer and therefore the quality of the applied coating. It is therefore an advantage to "freeze" the coated layer right after application onto the sleeve carrier 13. The term "freeze" does not necessarily imply a full setting of the coated layer; a partial setting of the layer to prevent run-down of the coating liquid from the sleeve carrier 13 is sufficient to provide a uniform layer of coating material.

In a preferred embodiment, the irradiation stage 12 may be 360° all around and based on the use of UV LEDs and concentrating or collimating optics. UV LED's have several advantages compared to UV arc lamps, such as their compactness, acceptable wavelength and beam stability, good dose uniformity and a large linear dose regulation range. A disadvantage of the UV LED's is their relative low power output. UV LEDs however are relatively small and can be grouped together in such a way that their combined power is sufficient to cover the required UV curing range for different types of coating liquids, different thicknesses of coating layer, different sleeve diameters (i.e. distance from UV LED to peripheral surface of the sleeve), etc. A cross-sectional view of a first embodiment of an annular irradiation stage is shown in FIG. 3. The irradiation stage is construed around an array of LEDs 31, a Fresnel lens 32 with reflector 33 and collimating mirror 34. The role of the optics is twofold: firstly Fresnel lens 32 with reflector 33 concentrates the light from the array of LEDs 31 into the focal point of the collimating mirror 34, and secondly the collimating mirror 34 collimates the light from the array of LEDs 31 into parallel horizontal beams for irradiating the coated layer on the sleeve. Revolving this optical setup 360° around the coating axis provides radiation from an annular radiation source, i.e. an annular LED array, which is substantially collimated in the horizontal direction and substantially focused onto the coating axis 10, as illustrated by the arrows in the lower part of FIG. 2. A cross-sectional view of a second embodiment of an annular irradiation stage is illustrated in FIG. 4 and shows a LED 41 positioned at the focal point of a parabolic reflecting cavity 44 of collimator base 40. A heat sink 45 for removing heat from the LED 41 is integrated in the collimator base 40. The small size of the LED 41 allows it to be positioned in the focal point of the parabolic reflecting cavity 44 without creating substantial voids in the collimated output beam. Revolving this optical setup 360° around the coating axis results in an annular radiation source and annular collimating optics for providing annular radiation as explained above. The radiation energy contained in the collimated beam can be easily modulated, by adjusting the radiation intensity, so as to accommodate for the variation in distance or diameter of different sleeve carriers, as well as for variations in formulation of the coating liquid.

The result is a radiation beam with large beam uniformity, high beam stability, wide range of beam intensity adjustment (LEDs can be dimmed to a few % of their maximal output power or can be time modulated), and precise UV curing control through ease of calibration. The advantages are: (i) no extra mechanical adjustments required when changing sleeve carriers of different sleeve carrier diameters—short sleeve carrier change over time, (ii) irradiation power adaptable—no power loss, and (iii) uniform beam properties for accurate and uniform curing—combined quality and speed aspects.

The annular shape of the UV LED array 41 and associated collimating optics 44 of the irradiation stage 12 allows a uniform annular irradiation of the coated layer. Furthermore, its compactness and low weight allow the annular irradiation stage 12 to be fixedly mounted on the annular coating stage 11. In operation, the annular irradiation stage 12 then moves along with the annular coating stage 11 and only one drive mechanism for moving the assembly up and down the sleeve carrier 13 is required.

Certain applications may require the use of a multitude of irradiation stages 12, mounted in cascade, for providing radiation with different wavelengths, at different distances from the coating stage 11, providing different radiation power, etc. The multitude of irradiation stages may be mounted on top of each other as one assembly, which itself may be mounted onto the coating stage 11. Mechanically linking the stages together is not mandatory. It is however preferred that the stages be moveable up and down the sleeve carrier in a synchronized way.

Notwithstanding the movement of the coating stage 11 and possible disturbances of the liquid surface 25 in the coating collar 21, experiments show surprisingly that the coated layer, applied with a coating device as described above, is of very good homogeneity and surface evenness.

Rotating Irradiation Stage

Figure 5:
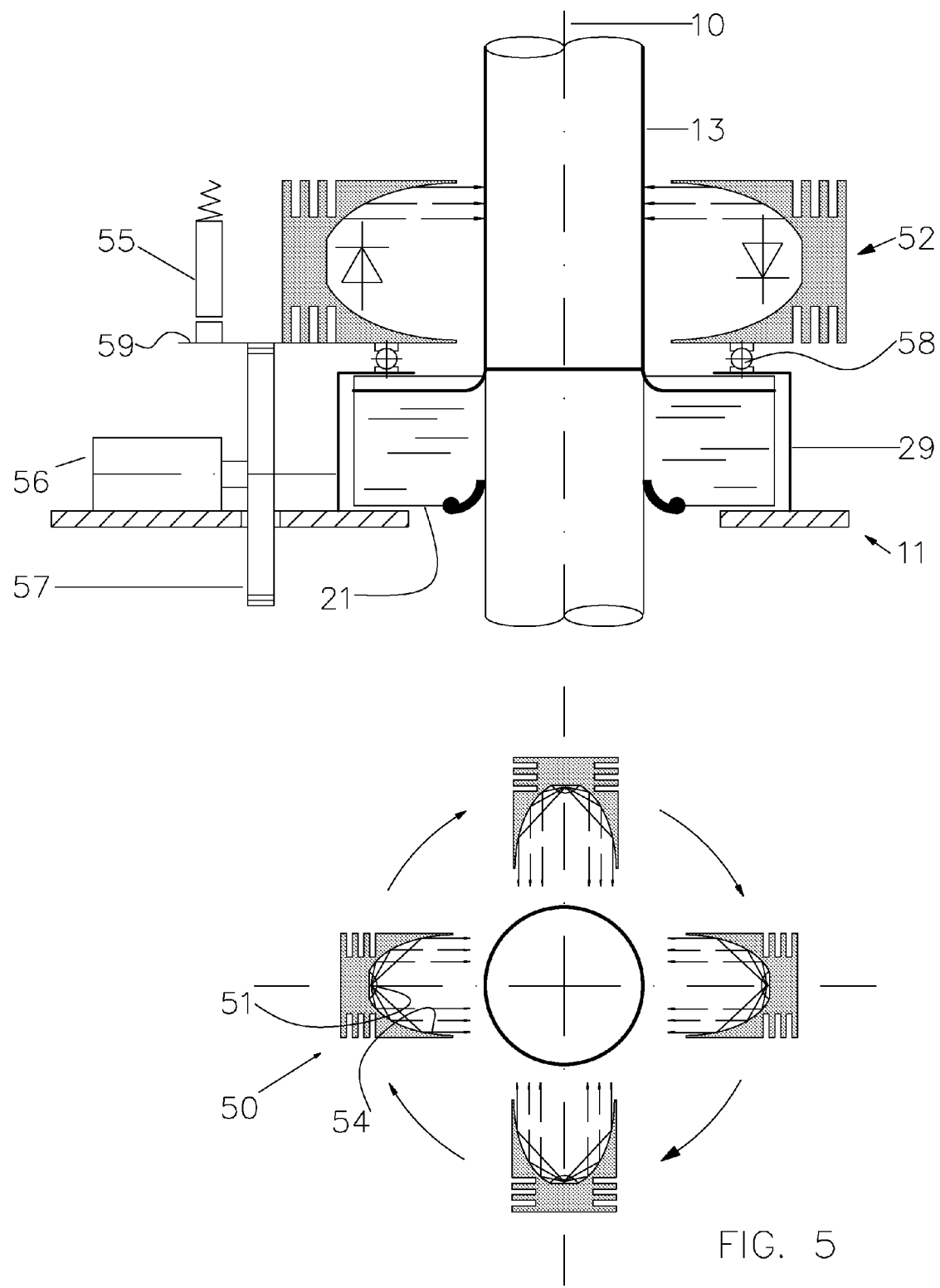
FIG. 5 shows an embodiment of the invention incorporating a spinning irradiation stage.

If however the irradiation stage is not all around annular, but includes one or more distinct circular irradiation sectors, one or more linear irradiation segments or singular irradiation units, the invention requires the irradiation stage to spin around the sleeve carrier in order to achieve a uniform irradiation all around the coated layer. This is illustrated in FIG. 5. Four singular irradiation units 50 are shown equably arranged around the coating axis 10. Each irradiation unit 50 may include an UV LED 51 and collimating paraboloidal optics 54 to produce a beam of collimated parallel UV light. A detailed description of one embodiment of a singular irradiation unit 50 may be found in granted U.S. Pat. No. 6,880,954. The singular irradiation units 50 may be mounted on a mounting base 59 of the irradiation stage 52. In order to provide all around uniform irradiation of the coated layer on the periphery of a sleeve carrier 13, the mounting base 59 rotates around the coating axis 10 while coating is performed, i.e. while the coating stages 11 moves vertically coaxial with the coating axis 10. Therefore the mounting base 59 is rotatably mounted on the coating stage 11 by e.g. an annular guide 58, and driven by a motor 56 and gear transmission 57 mounted on the coating stage 11. The gear transmission 57 may include a gear wheel cooperating with a crown gear mounted on the mounting base 59, but other transmission systems may be used as well such as bevel gears. The mounting base 59 of the irradiation stage 52 further includes multiple rotational electrical connectors 55, e.g. slip rings, for powering the multiple singular irradiation units 50 on the mounting base 59. Mechanical and electrical drives and interconnections between the irradiation stage 52 and the coating stage 11, e.g. the motor 56, the annular guide 58, the gear transmission 57 and the electrical slip connections 55, preferably are mounted onto or refer to the coating carriage 29 of the coating stage 11. This setup allows exchangeability of the annular coating collar 21 to adapt for different external diameter of the sleeve carriers to be coated, without requiring a change in the mechanical and electrical setup of the assembly of the coating stage 11 and the rotatable irradiation stage 52. The embodiment of a rotatable irradiation stage 52 has been illustrated in FIG. 5 with four singular irradiation units 50. As indicated above the rotatable irradiation stage may include other irradiation units such as irradiation segments based on a linear array of LEDs and a concentrating and collimating mirror, or they may include arc lamp systems although these are generally more complex and heavier to mount, connect and rotate. The rotation of the irradiation stage provides a 360° integration function for the radiation from the different irradiation units and smoothens the radiation intensity variations between different irradiation units and within each irradiation unit. An equable distribution of the irradiation units around the coating axis may be a preferred setup, but it is not required because the rotation of the irradiation stage will provide a 360° integration anyhow. A rotatable irradiation stage may therefore also be realized using only one singular irradiation unit.

Further Embodiments Details or Alternatives

In the embodiments described so far the irradiation source, e.g. an individual LED or an annular LED array, was linked to a corresponding collimating optics, e.g. a paraboloidal reflector respectively an annular collimating optics, and was considered one assembly. In an alternative embodiment the optics may be omitted in which case the LED radiation source directly irradiates the peripheral surface of the coated sleeve carrier. Rotation of the irradiation source may provide additional integration and averaging of the radiation energy. In another alternative embodiment a non-rotating annular collimating optics may be combined with a rotating radiation source. In this configuration, the radiation source orbits between the peripheral surface of the coated sleeve carrier and the annular collimating optics.

From Eq.1 we know that the viscosity of the coating liquid is an important parameter in controlling the thickness of the applied layer. It is therefore preferable to shield the coating liquid in the coating collar from any sources that may have a direct or indirect impact on the viscosity of the coating liquid. In radiation curable systems, the viscosity of a liquid is made controllable via exposure to radiation, i.e. the change the viscosity of a coated layer in order to freeze, set or cure the coated liquid is controlled via exposure to radiation. The coating device according to a preferred embodiment of the invention therefore preferably includes a radiation lock positioned between the radiation stage and the coating stage, and moveable therewith, for shutting off direct and indirect, e.g. scattered, radiation of the radiation source from the coating liquid contained in the coating collar. The radiation lock is preferably annular shaped and may for example be realized by providing a cover to the coating collar reservoir. A more advanced radiation lock would be an adjustable iris diaphragm as used in optics, the diaphragm opening being adjusted to be slightly larger than the diameter of the sleeve carrier to be coated. The annular radiation lock may be mechanically integrated in the coating stage, in the irradiation stage or as a separate unit in between both stages.

In applications using free radical UV curable liquids, it is known that the curing, in some cases, may be retarded or even non-existent due to the presence of oxygen in the cure zone. In this case, an inerted atmosphere may be used to enhance the cure capabilities. When related to UV curing, the term 'inerted' simply means the elimination in ideal situations or, more appropriately, the minimizing of the amount of inhibiting oxygen at the surface of the coating within the UV cure zone. In a vertical coating device according to a preferred embodiment of the invention, the cure zone refers to the area surrounding the coated layer on the peripheral surface of the sleeve carrier that is exposed to the radiation from the irradiation stage. An inertization environment may be created by (i) adding a gas such as nitrogen, argon or carbon dioxide to the atmosphere in the cure zone and especially close to or at the surface of the coated layer, and (ii) minimizing the possibility of ingress of air, a.o. through a drag effect resulting from the relative movement between the coated layer and the irradiation stage, in that zone.

Adding an intertization gas, such as nitrogen, argon or carbon dioxide, to the atmosphere in the cure zone may be accomplished by use of an annular manifold, connected with flexible tubing to a source of intertization gas housed in the vertical support column of the coating device. Annular clearance seals at both ends of the cure zone, i.e. at the upper and lower end of the irradiation stage, with a small clearance to the peripheral surface of the coated sleeve carrier may be used to prevent the inertization gas from flowing out of the cure zone. These seals preferably have an adjustable inner diameter to fit with a small clearance to the various sleeve carrier diameters. Iris diaphragms may be suitable seals for this purpose. A controlled flow of inertization gas within the cure zone may be realized when using two manifolds, i.e. an inlet and outlet manifold.

The ingress of air in the cure zone is likely to occur at the lower end of the cure zone when the coating stage moves downward during the coating process, that is, from between the coating stage and the irradiation stage. Counteracting the air intake may be realized by an annular blow knife at the lower entrance of the curing zone, i.e. between the irradiation stage and the coating stage. The annular blow knife, moving along between the coating stage and the irradiation stage, may be connected with flexible tubing to a source of inertization gas housed in the vertical support column of the coating device.

Adding a "closed" inertization environment to the irradiation stage has been described for oxygen inhibition in free radical UV curing systems. Depending on the coating formulation and the way the coated liquid layer is surface-cured, other embodiments of an intertization environment may be thought of.

Instead of providing and integrating a series of supplementary tools in and around the moveable irradiation stage to create an inertization environment in the cure zone, the entire coating device may be capped to close off the device from the ambient environment, in which case the task of creation of an intertization environment within the coating device is much simpler. Alternatively, the entire coating device may be installed in an inert environment provided by the end user.

LED Technology

An advantage of using LED technology for irradiating the coated layer is that the radiation intensity, and therefore the amount of radiation energy received by the coated layer, is easily adjustable. In one example the radiation intensity may be adjusted as a function of the coated layer thickness or a corresponding process variable (see Eq.1 above), e.g. the radiation intensity may be adjusted as a function of the viscosity of the applied coating liquid or the coating speed. In another example the radiation intensity may be adjusted as a function of the coating formulation or a component in the coating formulation, e.g. the UV LED power may be adjusted as a function of the amount of photo-initiators or sensitizers included in a UV coating liquid. In still another example the radiation intensity may be adjusted as a function of the optical distance between the radiation source and the peripheral surface of the coated sleeve carrier, e.g. the received radiation energy per unit area on the peripheral surface of the coated sleeve carrier in FIG. 2 varies with the sleeve carrier diameter and may be calculated and compensated for by adjusting the radiation intensity or power of the LEDs.

Compared to alternative radiation technologies such as for example arc lamps sources, LED technology provides the advantage of a small footprint and good beam and wavelength stability.

A further advantage of LED technology is their narrow bandwidth and singular spectral output, and the possible choice of a mixture of different spectral output UV LEDs. This choice of single wavelength UV output or a combination of spectral outputs allows for the further process tuning of the UV curing and of the coating chemistry, now mainly centred in the UVA and UV Visible ranges. A combination of spectral outputs can easily be selected at random by the mere ON and OFF switching of banks of different UV LED spectral output. Furthermore, the nearly complete absence of any IR radiation of these UV LEDs eliminates the need for IR-absorption filters, such as water-filled reservoirs, and is a bonus in reducing local and uneven subject heating.

Still further advantages of LED technology are its compactness, low weight and the ongoing technological trend towards higher power LEDs.

Laser Curing

Figure 6:
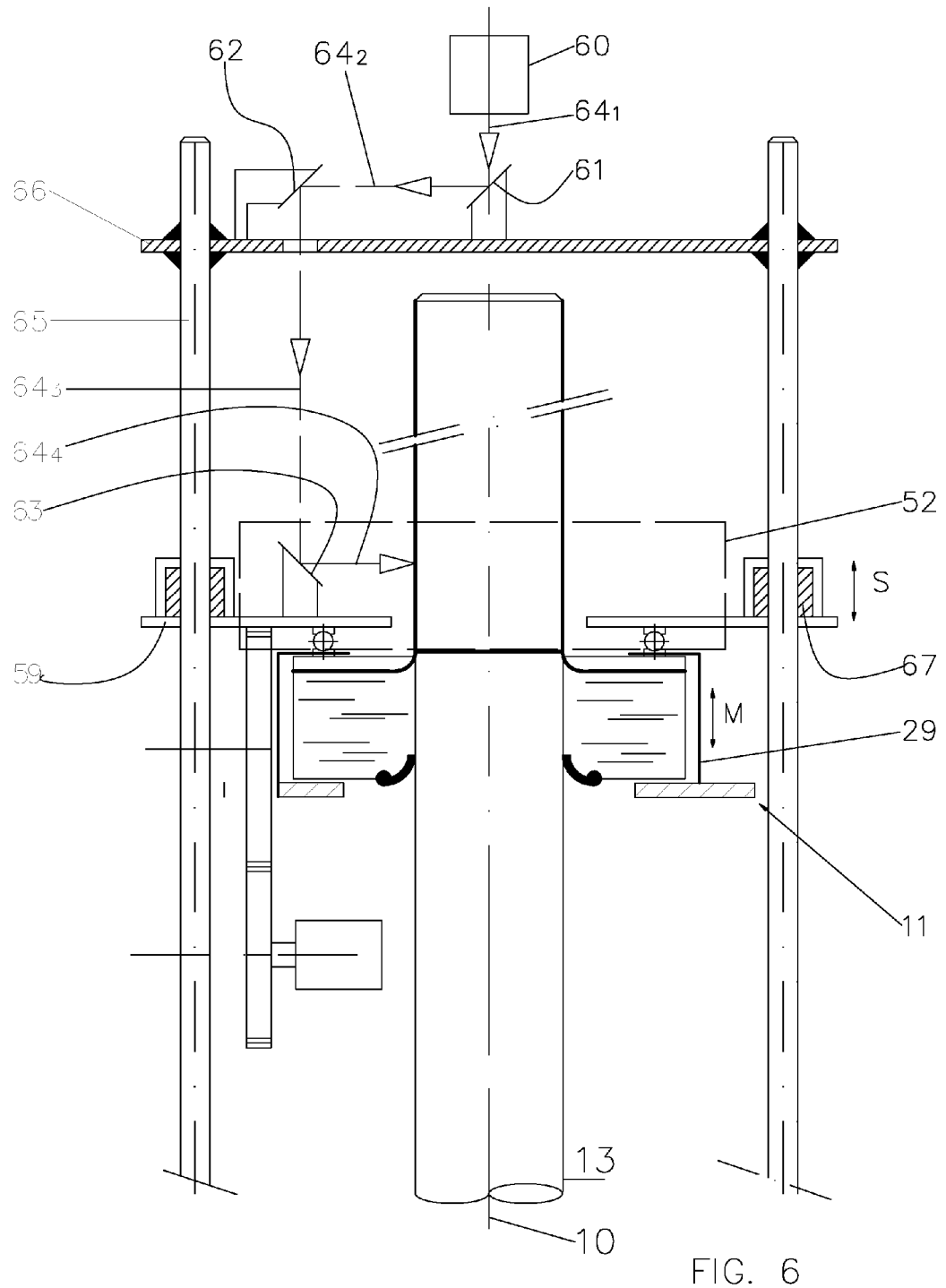
FIG. 6 shows an embodiment of the invention incorporating a spinning laser beam for irradiating the coated layer.

An alternative embodiment of a coating device according to the invention is shown in FIG. 6 and may include a rotating irradiation stage with a laser beam 64 as a single rotating irradiation unit. The laser beam 64 may be provided from a fixed laser source 60 above the sleeve carrier 13, possibly mounted onto the coating device's vertical support column (see FIG. 1). For that purpose, the sleeve carrier is single-ended mounted via the bottom flange or mounting head of the coating device. The laser source 60 may be mounted coaxial with the coating axis 10 for creating a laser beam 64 starting off along the coating axis 10. A spinning optical path is provided for guiding the fixed laser beam starting off at the laser source 60 to a spinning mirror 63 used for directing the laser beam onto the peripheral surface of the sleeve carrier 13. In the embodiment shown in FIG. 6, the spinning optical path is created via a rotating central mirror 61 deflecting the starting laser beam $64_1$ in a direction perpendicular to the coating axis 10 and spinning the laser beam around the coating axis 10. A first spinning mirror 62, co-operating with the rotating central mirror 61, deflects the spinning laser beam $64_2$ parallel with the coating axis but at the outside of the sleeve carrier. Finally, a second spinning mirror 63 that is part of the rotating irradiation stage 52 co-operates with the first spinning mirror 62 and deflects the spinning laser beam $64_3$ towards the coating axis 10 thereby projecting laser beam $64_4$ in a spinning way onto the coated layer on the peripheral surface of the sleeve carrier 13. The synchronization of the multiple co-operating mirrors 61-62-63 may be realized by fixing their angular position via a mechanical framework 65-66 attached to the mounting base 59 of the rotating irradiation stage 52. The framework 65-66 therefore spins along with the irradiation stage 52. The spinning of the laser beam 64 is therefore completely controlled by and synchronized with the rotation of the irradiation stage 52.

In a preferred embodiment, as shown in FIG. 6, a vertical guiding system 67 may be installed to keep the rotating framework element 66, and mounted thereon central mirror 61 and first spinning mirror 62, at a fixed height while the coating stage 11 and spinning irradiation stage 52 are moving up and down during a coating operation. If the vertical position, i.e. the height, of the rotating framework element 66 is fixed via for example a mechanical reference or link to the coatings device's vertical support column, the vertical guiding device 67 may include simple bearings. If the vertical position, i.e. the height, of the rotating framework element 66 is not fixed with a mechanical reference, the vertical guiding system 67 preferably include an active linear motion system (not shown) driven to keep the rotating framework element 66 at a fixed vertical height independent of a vertical movement of the coating stage and irradiation stage. The main advantage of the vertical guiding system 67 is to reduce the required installation height for the coating device.

In another embodiment the rotating framework element 66 may be mounted completely independent from the coating/irradiation stage. The spinning framework elements 65 and vertical guiding system 67 may then be omitted. However the rotation of the irradiation stage and the framework element 66 still needs to be synchronized in order to preserve the spinning optical path that guides the laser beam 64 onto the peripheral surface of the sleeve carrier 13. The coating device may then include two synchronized independent spinning entities.

In order to avoid collision of the spinning framework elements 65 with the mechanism for lifting and lowering the coating carriage, the lifting and lowering mechanism as illustrated in FIG. 1, integrated in the peripheral vertical support column, preferably is replaced by a linear motion system operating completely within the space envelope of the spinning framework element 65. Telescopic lift systems operating within this space envelope may for example be used.

The above disclosed preferred embodiments of the invention are described with reference to a laser system. The inventive concept however is not limited thereto and in general includes the use of a fixed mounted radiation source linked to a spinning optical path to guide the radiation beam from the fixed radiation source all around the peripheral surface of the sleeve carrier in synchronism with the vertical coating movement of a coating stage. Any radiation source that provides the required type of radiation, with enough power to at least partially cure the coated layer on the peripheral surface of a sleeve carrier, may be used.

Different Sleeve Carrier Sizes

It has been mentioned in a previous section that the radiation power may be adjusted as a function of the optical distance from the irradiation source to the peripheral surface of the sleeve carrier, such that adequate curing or "freezing" of the coated layer onto the peripheral surface of the sleeve carrier is achieved. This improves the compatibility of the irradiation stage with different sleeve carrier diameters. It is especially advantageous when the irradiation stage configuration is fixed and wherein the irradiation units are positioned outside a cylindrical space envelope around the coating axis occupied by the largest sleeve carrier diameter within a range of different sleeve carrier diameters. Alternatively, when the irradiation stage configuration is adjustable, the radial position of individual irradiation units from the coating axis, i.e. their radial coordinate in a polar coordinate system around the coating axis, and/or the spinning velocity of these units around the coating axis may be adjusted in order to keep the radiation energy received per unit area on the peripheral surface of sleeve carriers of different diameters constant.

Regarding the operation of the coating stage with different size sleeve carriers, the coating meniscus and the annular seal are important issues. The annular seal around the peripheral surface of the sleeve carrier prevents leakage and run down of coating liquid from the coating collar. When changing sleeve carrier diameter, either the entire coating collar (including the annular seal) may be replaced by another suited for the new sleeve carrier diameter or only the annular seal may be replaced or adjusted to fit with the new sleeve carrier diameter. If the annular seal is realized as an iris diaphragm of which the aperture is adjustable within a range, no replacement parts are required when changing the sleeve carrier diameter, provided that the sleeve carrier diameter falls within the range of the adjustable aperture. If the annular seal is removeably attached to the coating collar, a seal with a different fixed internal diameter may be used. The range of annular seal internal diameters that can be used with a coating collar is determining the maximum and minimum sleeve carrier diameter that can be coated with that coating collar.

Preferably that coating stage and the irradiation stage are designed to support the same range of sleeve carrier diameters so that both modules can be pre-assembled as a tandem and be inserted or replaced as one assembly.

Drive Systems & Process Control

In the embodiments described above, the irradiation stage or multitude of irradiation stages are mounted on top of the coating stage and move together with the coating stage as a single "coating assembly". From a mechanical point of view, this provides the advantage that only one lifting and lowering mechanism is required to operate the vertical coating device, whereas from an electrical point of view, all electrical connections to the "coating assembly" may be provided through a single cable carrier between the stationary vertical support column and the moving "coating assembly".

Obtaining a coated layer onto sleeve carriers with a controlled and uniform thickness, using one of the coating devices described above, may be difficult to achieve without any feedback regarding the irradiation dose and irradiation uniformity effectively applied to the coated layer. Therefore an energy dose controlling system may be added to the "coating assembly" for measuring the effective curing rate of the applied layer and adjusting the applied energy dose, spinning velocity (if applicable) and/or coating speed in a closed loop system. A near-infrared spectrometer may for example be used to measure the degree of UV or EB curing, i.e. the curing rate, of the coated layer.

However, if the purpose of the irradiation stage is to only partially set the coated layer to prevent run-down of the coating liquid from the sleeve carrier, the irradiation dose is less critical and monitoring of the irradiation dose in a closed loop system may not be required. A calibration of the irradiation stage combined with open loop control may be sufficient.

A full cure of the coated layer may be provided off-line using existing sleeve processing devices or may be provided in-line using an additional radiation systems as disclosed in Japanese patent application JP 54-014630. A full cure of the coated layer may also be realized by adding radiation capacity to the existing irradiation stage. The additional capacity may be provided by increasing the radiation power (e.g. additional UV LED arrays), adding different radiation sources (e.g. adding deep cure UVA wavelength radiation to the surface cure UVC radiation), specially adapted collimating optics delivering a variable irradiation intensity as a function of the vertical distance to the coating meniscus (e.g. a radiation source with a collimating optics providing a concentrated high irradiation intensity close to the coating meniscus, to achieve surface curing of the coated layer, and a vertically spread out lower irradiation intensity further away from the coating meniscus, to realize deep curing of the coated layer), or by straightforward duplicating existing irradiations stages.

Operation

The coating device according to a preferred embodiment of the invention may be set up and prepared for coating operations without the presence of a sleeve carrier. Thereto, one of the flanges or mounting heads, for mounting the sleeve carrier onto the coating device, may be used to provide a home position to the coating assembly. The flange or mounting head providing this home position has a similar or slightly smaller external diameter than the diameter of the sleeve carriers intended to be used with the flange or mounting head. When the coating assembly is in its home position, the annular seal of the coating collar may be adjusted to fit with the sleeve carrier diameter, even prior to mounting the sleeve carrier in the coating device, and the coating collar may be filled with a coating liquid, without leakage. The coating stage is then ready for coating operations.

If flanges or mounting heads are used with substantially different external diameter than the diameter of the sleeve carriers to be coated, the preparation of the coating assembly cannot be performed without the presence of a sleeve carrier mounted on the coating device. A home position for the coating assembly should then be provided by the sleeve itself. This is however not a preferred situation as it requires additional care and setup of the coating collar with each change of sleeve carrier.

After preparing the coating assembly and mounting the sleeve carrier on the coating device, the lifting and lowering mechanism moves the coating assembly to a start position with the coating meniscus close to or just past an end of the sleeve carrier, depending on the type of flange or mounting head used. The coating process preferably starts at the upper end of the sleeve carrier and continues in a downward direction to the lower end of the sleeve carrier while the lifting and lowering mechanism moves the coating assembly downwards. As the coating assembly moves downward, the irradiation stage follows immediately after and irradiates the just coated layer to cure at least the surface of the coated layer, which prevents run down of the applied coating liquid. If a spinning irradiation stage is used, the irradiation stage not only follows the coating meniscus at a fixed distance, but in addition spins around the sleeve carrier to generate a uniform 360° irradiation of the coated layer. At the end of the coating process, the lifting and lowering mechanism halts the coating assembly with the coating meniscus close to or just past the lower end of the sleeve carrier, depending on the type of flange or mounting head used. If the flanges or mounting heads allow end-to-end coating of the sleeve carrier, the coating assembly will move that far downward to allow the irradiation stage to irradiate the coated layer up to the lower end of the sleeve carrier. The thickness of the coated layer may be controlled via the velocity of the coating assembly moving downward, the viscosity of the coating liquid or the number of successive coating operations applied (see hereinafter). After the coating process, the coating assembly is left at its position against the lower or upper flange or mounting head and the coated sleeve may be removed without special care for the coating collar.

Alternatively, a coating layer may be applied while the coating assembly moves upward, in which case the coating mechanism is a squeegee type coating mechanism, instead of the immersion type coating during a downward movement of the coating assembly as described above. Application of a coating layer during upward movement of the coating assembly may require an irradiation stage positioned below the coating stage and moving together with the coating stage to cure at least the surface of the squeegee coated layer. Squeegee type coated layers, associated with an upward movement of the coating collar, may be thinner than immersion type coated layers, associated with a downward movement of the coating collar. Unfortunately there is no formula, analogous to Eq.1, known to the inventors to predict the thickness of the squeegee type coated layer. Each of the alternatives may therefore have advantages in specific applications.

The coating device may also operate in a multiple pass mode with intermediate "curing" of the surface of each of the applied layers. The coating may be mainly bidirectional or unidirectional as will become clear from the following.

A multiple pass operating mode may include the steps of applying a first immersion coated layer while moving a coating assembly downward and curing at least the surface of the first immersion coated layer with an upper irradiation stage positioned above and moving with the coating stage; then moving the coating assembly upward while applying a first squeegee coated layer and optionally curing at least the surface of the first squeegee coated layer with a lower irradiation stage positioned below and moving with the coating stage; afterwards applying a second immersion coated layer while moving the coating assembly downward and curing at least the surface of the second immersion coated layer with the upper irradiation stage moving with the coating stage, etc. As the annular squeegee of the coating collar is designed to prevent leakage of coating liquid from the coating collar at the sliding contact between the coating collar and the sleeve carrier, the thickness of the layer applied via a squeegee type coating during an upward movement of the coating assembly typically is significantly less than the thickness of the layer applied by the immersion coating during the downward movement of the coating assembly. In this case, there is a main (immersion) coating action during the downward movement of the coating assembly and a fractional (squeegee) coating action during the upward movement thereof. The coating is primarily unidirectional. Intermediate curing of the fractional (squeegee) coating layer may therefore not be necessary as it will merge with the significantly thicker subsequent main (immersion) coating layer from a subsequent coating action during a downward movement of the coating assembly. The immersion coated layer is of course irradiated using the upper irradiation stage. So, a multiple pass coating device according to a preferred embodiment of the invention not necessarily includes an upper and a lower irradiation stage to cure at least the surface of the coated layer in both coating directions; a single irradiation stage linked with a main coating direction may serve.

Multiple pass operation of the coating device as described may be used for applying uniform thick layers of coating material onto sleeve carriers. It may for example be used in cases where physico-chemical parameters of the coating liquid, e.g. viscosity, or limitations of the coating device, e.g. coating velocity, would limit the thickness of a coated layer as predicted from Eq.1 to a value below what is functionally required for the application.

Multiple pass operation of the coating device may also be used for applying a multitude of layers of different coating liquid formulations. The coating liquids may have different physicochemical properties, e.g. viscosity, or the corresponding coated layers may have different physicochemical or mechanical properties such as compressibility, hardness, wear-resistance, wettability.

E.g. for the production of an optimized "elastomeric floor" on the sleeve carrier, to be used in the method according to a preferred embodiment of the present invention, it may be desirable to provide compressible lower layer(s) (suitable for absorbing for example the unevenness in corrugated board printing material) and upper layer(s) optimized towards adhesion with the inkjetted relief image (for increased durability and suitable for longer print runs). If desired a complete physicochemical thickness profile may be created for the coated multilayer.

The flanges or mounting heads may require regular cleaning to remove coating liquid residues from end-to-end coating processes or linked with their use as home position for the coating collar. A coating liquid repelling layer on the flanges or mounting heads may facilitate this cleaning.

Only if a different size of sleeve is to be coated, different flanges or mounting heads may be installed and the annular seal of the coating collar may be changed or adjusted to match with the new sleeve carrier diameter. An example of an adjustable annular seal is an adjustable iris diaphragm including overlapping sealing leaves wherein the diaphragm opening, i.e. the aperture, is adjustable through adjustment of the position of the leaves relative to each other, as known in photography. The higher the number of leaves in the iris diaphragm, the better the sealing property of the iris diaphragm around the peripheral surface of the sleeve.

Forming the Relief Image by Inkjet

The relief image is formed on the one or more, at least partially cured uniform layer(s) of the sleeve body. Any known inkjet method to build 3D images may be used, in particular those described in EP 1 428 666, EP 1 437 882 and EP 1 637 322.

In a first step, the sleeve body provided with the one or more at least partially cured layers is mounted on a cylindrical axe of a 3-D inkjet printer. If the diameter of the sleeve body is too large to fit on the cylinder of the 3D inkjet printer, a so called bridge sleeve, positioned between the cylinder and the sleeve body, may be used.

The relief image is formed by imagewise jetting at least two layers of a curable jetting fluid on the sleeve body. Preferably, each imagewise jetted layer of a curable jetting fluid is at least partially cured, to immobilize the jetted droplets, before jetting the subsequent layer. However, curing may also be performed on more than one subsequently jetted layers of a curable jetting fluid.

The layers forming the relief image may all be formed with the same curable jetting fluid, alternatively the layers forming the relief image may be formed with at least two different curable jetting fluids. For example, the layers forming the top of the relief image may be formed with curable jetting fluids, resulting upon curing in layers having a higher Shore A Hardness than the layers forming the bottom of the relief image, for example to increase the run length of the printing forme. Or, the layers forming the top of the relief image may be formed with curable jetting fluids, resulting upon curing in layers having optimal printing properties. Alternatively, the layers of the relief image nearest to the sleeve body may be formed with curable jetting fluids, resulting upon curing in an optimized adhesion between the relief image and the sleeve body.

Alternatively, curable jetting fluids having a different composition may be used within one layer of the relief image. For example, small printing areas may be formed with curable jetting fluids, resulting upon curing in a higher Shore Hardness, whereas large printing areas may be formed with curable jetting fluids, resulting upon curing in a lower Shore Hardness.

The method according to a preferred embodiment of the present invention enables the formation of flexographic sleeve formes, i.e. the "elastomeric floor" and the relief image consecutively within a limited time frame and close to the printing press.

As mentioned above, improved adhesion of the relief image to the "elastomeric floor" may be realized by partially curing the "elastomeric floor". However, the improved adhesion may diminish when the time between partially curing the "elastomeric floor" and forming the relief image on it by inkjet becomes too long, depending on the storage conditions of the sleeve body, i.e. humidity, temperature and lightning conditions. Preferably, the relief image is formed within 24 hours, more preferably within 12 hours after providing the one or more at least partially cured uniform layer on the sleeve body.

Curable Jettable Liquid

The curable jettable liquid suitable for the method for preparing a flexographic printing sleeve forme according to a preferred embodiment of the present invention preferably contains at least four components: (i) a monofunctional monomer, (ii) a polyfunctional monomer or oligomer, (iii) a plasticizer and (iv) a photo-initiator. The curable jettable liquid may further contain a polymerization inhibitor to restrain polymerization by heat or actinic radiation, at least one acid functionalized monomer or oligomer, at least one elastomer, at least one surfactant for controlling the spreading of the curable jettable liquid droplet, at least one colorant for increasing the contrast between the jetted image and the background. The curable jettable liquid may further contain water and/or organic liquids, such as alcohols, fluorinated solvents and dipolar aprotic liquids.

The curable jettable liquid may also further contain at least one humectant, at least one biocide to prevent unwanted microbial growth over time. In addition, the curable jettable liquid may further contain additives such as buffering agents, anti-mold agents, pH adjustment agents, electric conductivity adjustment agents, chelating agents, anti-rusting agents and light stabilizers. Such additives may be incorporated in the curable jettable liquid in any effective amount, as desired. Examples of pH controlling agents suitable for curable jettable liquid include, but are not limited to, acids, and bases, including hydroxides of alkali metals such as lithium hydroxide, sodium hydroxide and potassium hydroxide.

The curable jettable liquid preferably has a viscosity at a shear rate of $100\ s^{-1}$ and at a temperature between 15 and 70° C. of not more than 100 mPa·s, preferably less than 50 mPa·s, and more preferably less than 15 mPa·s.

Monofunctional Monomers

Any polymerizable monofunctional monomer commonly known in the art may be employed. Particular preferred polymerizable monofunctional monomers are disclosed in EP 1 637 926 paragraph [0054] to [0058]. Two or more monofunctional monomers can be used in combination. The monofunctional monomer preferably has a viscosity smaller than 30 mPa·s at a shear rate of $100\ s^{-1}$ and at a temperature between 15 and 70° C.

Polyfunctional Monomers and Oligomers

Any polymerizable polyfunctional monomer and oligomer commonly known in the art may be employed. Particular preferred polyfunctional monomers and oligomers are disclosed in EP 1 637 926 paragraph [0059] to [0063].

Two or more polyfunctional monomers and/or oligomers can be used in combination.

The polyfunctional monomer or oligomer preferably has a viscosity larger than 50 mPa·s at a shear rate of $100\ s^{-1}$ and at a temperature between 15 and 70° C.

Acid Functionalized Monomers and Oligomers

Any polymerizable acid functionalized monomer and oligomer commonly known in the art may be employed. Particular preferred acid functionalized monomers and oligomers are disclosed in EP 1 637 926 paragraph [0066] to [0070].

Photo-Initiators

The photo-initiator, upon absorption of actinic radiation, preferably UV-radiation, forms free radicals or cations, i.e.

high-energy species inducing polymerization and crosslinking of the monomers and oligomers in the jettable curable liquid.

A preferred amount of photo-initiator is 1 to 10% by weight, more preferably 1 to 7% by weight, of the total curable jettable liquid weight.

A combination of two or more photo-initiators may be used. A photo-initiator system, including a photo-initiator and a co-initiator, may also be used. A suitable photo-initiator system includes a photo-initiator, which upon absorption of actinic radiation forms free radicals by hydrogen abstraction or electron extraction from a second compound, the co-initiator. The co-initiator becomes the actual initiating free radical.

Irradiation with actinic radiation may be realized in two steps, each step using actinic radiation having a different wavelength and/or intensity. In such cases it is preferred to use 2 types of photo-initiators, chosen in function of the different actinic radiation used.

Suitable photo-initiators are disclosed in EP 1 637 926 paragraph [0077] to [0079].

Inhibitors

Suitable polymerization inhibitors include phenol type antioxidants, hindered amine light stabilizers, phosphor type antioxidants, hydroquinone monomethyl ether commonly used in (meth)acrylate monomers, and hydroquinone, methylhydroquinone, t-butylcatechol, pyrogallol may also be used. Of these, a phenol compound having a double bond in molecules derived from acrylic acid is particularly preferred due to its having a polymerization-restraining effect even when heated in a closed, oxygen-free environment. Suitable inhibitors are, for example, SUMILIZER® GA-80, SUMILIZER® GM and SUMILIZER® GS produced by Sumitomo Chemical Co., Ltd.

Since excessive addition of these polymerization inhibitors will lower the sensitivity to curing of the curable jettable liquid, it is preferred that the amount capable of preventing polymerization be determined prior to blending. The amount of a polymerization inhibitor is generally between 200 and 20 000 ppm of the total curable jettable liquid weight.

Oxygen Inhibition

Suitable combinations of compounds which decrease oxygen polymerization inhibition with radical polymerization inhibitors are: 2-benzyl-2-dimethylamino-1-(4-morpholinophenyl)-butane-1 and 1-hydroxy-cyclohexyl-phenyl-ketone; 1-hydroxy-cyclohexyl-phenyl-ketone and benzophenone; 2-methyl-1[4-(methylthio)phenyl]-2-morpholino-propane-1-on and diethylthioxanthone or isopropylthioxanthone; and benzophenone and acrylate derivatives having a tertiary amino group, and addition of tertiary amines. An amine compound is commonly employed to decrease an oxygen polymerization inhibition or to increase sensitivity. However, when an amine compound is used in combination with a high acid value compound, the storage stability at high temperature tends to be decreased. Therefore, specifically, the use of an amine compound with a high acid value compound in ink-jet printing should be avoided.

Synergist additives may be used to improve the curing quality and to diminish the influence of the oxygen inhibition. Such additives include, but are not limited to ACTILANE® 800 and ACTILANE® 725 available from AKZO NOBEL, EBECRYL® P115 and EBECRYL® 350 available from UCB CHEMICALS and CD 1012, Craynor CN 386 (amine modified acrylate) and Craynor CN 501 (amine modified ethoxylated trimethylolpropane triacrylate) available from CRAY VALLEY.

The content of the synergist additive is in the range of 0 to 50% by weight, preferably in the range of 5 to 35% by weight, based on the total weight of the curable jettable liquid.

Plasticizers

Plasticizers are usually used to improve the plasticity or to reduce the hardness of adhesives, sealing compounds and coating compositions. Plasticizers are liquid or solid, generally inert organic substances of low vapor pressure.

Suitable plasticizers are disclosed in EP 1 637 926 paragraph [0086] to [0089].

The amount of plasticizer is preferably at least 5% by weight, more preferably at least 10% by weight, each based on the total weight of the curable jettable liquid. The plasticizers may have molecular weights up to 30 000 but are preferably liquids having molecular weights of less than 5 000.

Elastomers

The elastomer may be a single binder or a mixture of various binders. The elastomeric binder is an elastomeric copolymer of a conjugated diene-type monomer and a polyene monomer having at least two non-conjugated double bonds, or an elastomeric copolymer of a conjugated diene-type monomer, a polyene monomer having at least two non-conjugated double bonds and a vinyl monomer copolymerizable with these monomers.

Preferred elastomers are disclosed in EP 1 637 926 paragraph [0092] and [0093].

Surfactants

The surfactant(s) may be anionic, cationic, non-ionic, or zwitter-ionic and are usually added in a total quantity below 20% by weight, more preferably in a total quantity below 10% by weight, each based on the total curable jettable liquid weight.

A fluorinated or silicone compound may be used as a surfactant, however, a potential drawback is bleed-out after image formation because the surfactant does not cross-link. It is therefore preferred to use a copolymerizable monomer having surface-active effects, for example, silicone-modified acrylates, silicone modified methacrylates, fluorinated acrylates, and fluorinated methacrylates.

Colorants

Colorants may be dyes or pigments or a combination thereof. Organic and/or inorganic pigments may be used.

Suitable dyes include direct dyes, acidic dyes, basic dyes and reactive dyes.

Suitable pigments are disclosed in EP 1 637 926 paragraphs [0098] to [0100].

The pigment is present in the range of 0.01 to 10% by weight, preferably in the range of 0.1 to 5% by weight, each based on the total weight of curable jettable liquid.

Solvents

The curable jettable liquid preferably does not contain an evaporable component, but sometimes, it can be advantageous to incorporate an extremely small amount of a solvent to improve adhesion to the ink-receiver surface after UV curing. In this case, the added solvent may be any amount in the range of 0.1 to 10.0% by weight, preferably in the range of 0.1 to 5.0% by weight, each based on the total weight of curable jettable liquid.

Humectants

When a solvent is used in the curable jettable liquid, a humectant may be added to prevent the clogging of the nozzle, due to its ability to slow down the evaporation rate of curable jettable liquid.

Suitable humectants are disclosed in EP 1 637 926 paragraph [0105]. A humectant is preferably added to the curable jettable liquid formulation in an amount of 0.01 to 20% by weight of the formulation, more preferably in an amount of 0.1 to 10% by weight of the formulation.

Biocides

Suitable biocides include sodium dehydroacetate, 2-phenoxyethanol, sodium benzoate, sodium pyridinethion-1-oxide, ethyl p-hydroxy-benzoate and 1,2-benzisothiazolin-3-one and salts thereof. A preferred biocide for the curable jettable liquid suitable for the method for manufacturing a flexographic printing plate according to the present invention, is PROXEL® GXL available from ZENECA COLOURS.

A biocide is preferably added in an amount of 0.001 to 3% by weight, more preferably in an amount of 0.01 to 1.00% by weight, each based on curable jettable liquid.

Preparation of a Curable Jettable Liquid

The curable jettable liquids may be prepared as known in the art by mixing or dispersing the ingredients together, optionally followed by milling, as described for example in EP 1 637 322 paragraph [0108] and [0109].

EXAMPLES

Materials

All materials used in the following examples were readily available from Aldrich Chemical Co. (Belgium) unless otherwise specified.

BR 7432 is an urethane acrylate oligomer from BOMAR SPECIALTIES

BR 7432 G is an urethane acrylate oligomer from BOMAR SPECIALTIES

SR 604 is a polypropyleneglycolmethacrylate from CRAY VALLEY

SR 506D is an isobornyl acrylate available from CRAY VALLEY

SR 531 is a cyclic trimethylolpopane formal acrylate from CRAY VALLEY

SR 285 is a tetrahydrofurfuryl acrylate from CRAY VALLEY

SR 340 is a 2-phenoxyethyl methacrylate from SARTOMER

CN137 is a low viscosity acrylate oligomer from SARTOMER

GENOMER 1122 is a monofunctional urethane acrylate

MIRAMER M100 is a dicaprolactone acrylate from RAHN AG

IRGACURE 651 is a photo-initiator from CIBA-GEIGY

IRGACURE 500 is a photo-initiator from CIBA-GEIGY

IRGACURE 127 is a photo-initiator from CIBA-GEIGY

IRGACURE 819 is a photo-initiator from CIBA-GEIGY

EBECRYL 11 is a polyethylene glycol diacrylate available from UCB

EBECRYL 168 is an acid modified methacrylate available from UCB

EBECRYL 770 is an acid functional polyester acrylate diluted with 40% HEMA available from UCB EBECRYL 1039 is a urethane monoacrylate from UCB EBECRYL 1360 is a polysiloxane hexaacrylate from UCB VERBATIM LDR32, a liquid photopolymer from Chemence VERBATIM ACCLAIM 25, a liquid photopolymer from Chemence VERBATIM ACCLAIM 32, a liquid photopolymer from Chemence VERBATIM LF 25C, a liquid photopolymer from Chemence VERBATIM LF 32C, a liquid photopolymer from Chemence VERBATIM 180 SP Clear, a liquid photopolymer from Chemence VERBATIM LF 25C, a liquid photopolymer from Chemence VERBATIM HR50, a liquid photopolymer from Chemence BHT is 2,6-di-t-buthyl-4-methylphenol from ALDRICH MH is 5 wt % of 2-methyl-hydrochinon from MITSUI in DPGDA Santicizer 278 is available from MONSANTO Perenol S Konz is a polysiloxane from HENKEL Yellow dye is 2-(4-{Butyl-[4-(2-methoxy-ethoxy)-phenyl]-amino}-benzylidene)-malononitrile available from AGFA Magenta dye is 2-Cyano-3-(4-dibutylamino-phenyl)-but-2-enedinitrile available from AGFA.

Example 1

Preparation of the Curable Inkjet Fluid IF-01

Inkjet fluid IF-01 was prepared by mixing the ingredients listed in Table 1.

TABLE 1

| Ingredient (g) | IF-01 |
| --- | --- |
| SR 506D | 199.0 |
| EBECRYL 11 | 178.0 |
| EBECRYL 168 | 84.0 |
| EBECRYL 770 | 337.0 |
| Sancticizer 278 | 120.0 |
| IRGACURE 500 | 48.0 |
| Perenol S Konz | 12.0 |
| MH | 2.4 |
| ethylacetate | 19.0 |

Preparation of the Photosensitive Layers PL-01 to PL-06

The coating solutions of the photosensitive layers PL-01 to PL-06 were prepared by mixing the ingredients listed in Table 2.

TABLE 2

| Ingredient (g) | PL-01 | PL-02 | PL-03 | PL-04 |
| --- | --- | --- | --- | --- |
| VERBATIM LDR32 | 95.0 | — | — | — |
| VERBATIM ACCLAIM 25 | — | 95.0 | — | — |
| VERBATIM ACCLAIM 32 | — | — | 95.0 | — |
| VERBATIM LF 25C | — | — | — | 95.0 |
| IRGACURE 127 | 5.0 | 5.0 | 5.0 | 5.0 |

| Ingredient (g) | PL-05 | PL-06 |
| --- | --- | --- |
| VERBATIM LF 32C | 95.0 | — |
| VERBATIM 180 SP Clear | — | 95.0 |
| IRGACURE 127 | 5.0 | 5.0 |

Coating of the Photosensitive Layers PL-01 to PL-06 on a Support

The photosensitive layers PL-01 to PL-06 were coated on a subbed polyester at a thickness of 290 μm. The subbing layer on the polyester had the following composition: 79.10 wt % of a copolymer vinylidenechloride-methylacrylate-itaconic acid (88/10/2); 18.60 wt % Kieselsol 100F from Bayer; 0.40 wt % Mersolat H from Bayer; 1.90 wt % Ultravon W from Ciba-Geigy.

Curing of the Coated Photosensitive Layers PL-01 to PL-06

UV-curing was performed on the coated layers PL-01 to PL-06 by 10 passages through a DRSE-120 conveyer, from FUSION UV SYSTEMS Ltd. equipped with a D-bulb. The conveyer speed was 20 m/min.; a power setting of 100% was used (=0.9 J/cm$^2$ on the surface of the coated layers).

Applying the Inkjet Fluid IF-01 on the Cured Layers PL-01 to PL-06

The inkjet fluid IF-01 was applied to the cured layers PL-01 to PL-06 with a paint brush system. The droplets were cured by passing the samples 8 times through the DRSE-120 conveyer described above. An UV-C postcuring was carried out with a light box equipped with 4 Philips TUV lamps ($\lambda_{max}$=254 nm) during 20 minutes.

Adhesion

The adhesion of the cured inkjet droplets on the cured layers PL-01 to PL-06 was evaluated as follows:

An ASTM tape from Peramcel was provided on both sides of the flexographic printing forme, i.e. one ASTM tape in contact with the cured droplets, the other ASTM tape on the backside of the PET support. After separating the ASTM tapes, it was found that the cured droplets were not detached from the cured layers PL-01 to PL-06.

Example 2

Preparation of the Photosensitive Layer PL-07

The coating solution of the photosensitive layer PL-07 was prepared by mixing the ingredients listed in Table 3.

TABLE 3

| Ingredient (g) | PL-07 |
|---|---|
| Verbatim HR50 | 22.8 |
| Irgacure 127 | 1.2 |
| IF-01 | 26.0 |

Coating of the Photosensitive Layer PL-07 on a Support

The photosensitive layer PL-07 was coated on a subbed polyester (see example 1) at a thickness of 290 μm.

Curing of the Coated Photosensitive Layer PL-07

UV-curing was performed on the coated layer PL-07 by 10 passages through the DRSE-120 conveyer described above.

Applying the Inkjet Fluid IF-01 on the Cured Layer PL-07

The inkjet fluid IF-01 was applied with a paint brush system on the cured layer PL-07 with a paint brush system. The droplets were cured by passing the samples 8 times through the DRSE-120 conveyer described above. An UV-C postcuring was carried out with a light box equipped with 4 Philips TUV lamps ($\lambda_{max}$=254 nm) during 20 minutes.

Adhesion

The adhesion of the cured inkjet droplets on the differently cured photolayer PL-07 was evaluated as described in Example 1.

After separating the ASTM tapes, it was found that the cured droplets were not detached from the cured layer PL-07.

Example 3

Preparation of the Curable Inkjet Fluid IF-02

Inkjet fluid IF-02 was prepared by mixing the ingredients listed in Table 4.

TABLE 4

| Ingredient (g) | IF-02 |
|---|---|
| SR 506D | 10.400 |
| EBECRYL 11 | 9.300 |
| EBECRYL 168 | 4.400 |
| EBECRYL 770 | 17.600 |
| SANCTICIZER 278 | 6.250 |
| IRGACURE 500 | 2.500 |
| Perenol S Konz | 1.000 |
| MH | 0.125 |
| ethylacetate | 1.000 |
| Yellow dye | 0.023 |
| Magenta dye | 0.023 |

Preparation of the Photosensitive Layer PL-08

The coating solution of the photosensitive layer PL-08 was prepared by mixing the ingredients listed in Table 5.

TABLE 5

| Ingredient (g) | PL-08 |
|---|---|
| BR 7432G | 31.00 |
| SR 604 | 6.50 |
| Ebecryl 1039 | 6.50 |
| SR 531 | 6.50 |
| Genomer 1122 | 6.50 |
| Irgacure 651 | 2.50 |
| BHT | 0.03 |

Coating of the Photosensitive Layer PL-08 on a Support

The formulation of Table 5 was coated on a subbed polyester support (see example 1) at a thickness of 290 μm.

Curing of the Coated Photosensitive Layer PL-08

The coated photosensitive layer PL-08 was put in a nitrogen box. The oxygen was removed while circulating nitrogen. UV-A curing was carried out with a UV-A light box equipped with 8 Philips TL 20 W/10 ($\lambda_{max}$=370 nm) during 30 seconds. The distance between the sample and the curing lamps was approximately 10 cm.

Applying the Inkjet Fluid IF-02 on the Cured Layer PL-08

The inkjet fluid IF-02 was applied with a paint brush on the cured photosensitive layer PL-08. UV-A curing was carried out in a UV-A light box equipped with 8 Philips TL 20 W/10 ($\lambda_{max}$=370 nm) under nitrogen during 3 minutes. The distance between the sample and the curing lamps was approximately 10 cm. An UV-C postcuring was carried out with a light box equipped with 4 Philips TUV lamps ($\lambda_{max}$=254 nm) during 20 minutes.

Adhesion

The adhesion of the cured fluid IF-02 droplets on the photolayer PL-08 was evaluated as described in Example 1.

After separating the ASTM tapes, it was found that the cured droplets were not detached from the cured layer PL-08.

Example 4

Preparation of the Curable Inkjet Fluid IF-03

Inkjet fluid IF-03 was prepared by mixing the ingredients listed in Table 6.

TABLE 6

| Ingredient (g) | IF-03 |
|---|---|
| SR 506D | 11.40 |
| EBECRYL 11 | 11.50 |
| Sancticizer 278 | 6.25 |

TABLE 6-continued

| Ingredient (g) | IF-03 |
|---|---|
| IRGACURE 819 | 2.50 |
| GENOMER 1122 | 16.60 |

Preparation of the Photosensitive Layer PL-09

The coating solution of the photosensitive layer PL-09 was prepared by mixing the ingredients listed in Table 7.

TABLE 7

| Ingredient (g) | PL-09 |
|---|---|
| BR 7432 | 25.00 |
| BR 7432G | 25.00 |
| SR531 | 10.00 |
| SR285 | 5.00 |
| SR340 | 8.00 |
| CN137 | 4.00 |
| GENOMER 1122 | 8.00 |
| MIRAMER M100 | 8.00 |
| EBECRYL 1360 | 5.00 |
| IRGACURE 651 | 4.00 |

Coating of the Photosensitive Layer PL-09 on a Support

The formulation of Table 7 was coated on a subbed polyester support (see example 1) at a thickness of 290 μm.

Curing of the Coated Photosensitive Layer PL-09

One sample of the coated PL-09, PL-0/01, was UV-A cured in a UV-A light box during 2 minutes ($\lambda_{max}$=370 nm), followed by an UV-C curing during 20 minutes in a UV-C light box ($\lambda_{max}$=254 nm). Sample PL-09/01 did not show any tackiness, indicating that it is completely cured.

Another sample of the coated PL-09, PL-09/02, was UV-A cured in a UV-A light box during 9 seconds. Sample PL-09/02, after curing, did show some tackiness, indicating that it is not completely cured, i.e. partially cured.

Applying the Inkjet Fluid if-03 on the Samples PL-09/01 and /02.

The inkjet fluid IF-03 was applied with a paint brush system on the samples PL-09/01 and /02. UV-A curing was carried out in an UV-A light box equipped with 8 Philips TL 20 W/10 ($\lambda_{max}$=370 nm) under nitrogen during 2 minutes. The distance between the sample and the curing lamps was approximately 10 cm. An UV-C postcuring was carried out with a light box equipped with 4 Philips TUV lamps ($\lambda_{max}$=254 nm) during 20 minutes.

Adhesion

The adhesion of the droplets of IF-03 on both samples PL-09/01 and /02 was determined using a manual peel test. With a sharp knife, the detachability of the droplets was investigated.

The droplets of IF-03, jetted on the completely cured sample PL-09/01 could be detached rather easily. In contrast, it was impossible to detach the droplets of IF-03, jetted on the partially cured sample PL-09/02.

This example indicates very clearly that adhesion of the relief image, formed by image wise jetting of curable fluids on a partially cured "floor" is stronger compared to the adhesion of the relief image on a completely cured "floor". An explanation may be the presence of unreacted monomer in "floor" upon partial curing, which may react with monomers of the relief image upon overall curing.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A method of making a flexographic printing sleeve forme comprising the steps of:
    forming a sleeve body by providing one or more at least partially cured uniform layers on a sleeve carrier by:
    supporting the sleeve carrier in a vertical position coaxial with a coating axis;
    providing an annular coating collar, supplying a curable composition to the annular coating collar and moving the annular coating collar along the sleeve carrier in a vertical direction coaxial with the coating axis thereby coating a layer of the curable composition onto a peripheral surface of the sleeve carrier;
    providing an irradiation stage and moving the irradiation stage in synchronism with the annular coating collar along the sleeve carrier in the vertical direction while irradiating the coated layer of the curable composition so as to at least partially cure the layer of the curable composition onto the peripheral surface of the sleeve carrier; and
    optionally repeating the steps of moving the coating collar and the irradiation stage while irradiating the layer of the curable composition coated by the coating collar a plurality of times so as to apply a plurality of the layers of the curable composition onto the peripheral surface of the sleeve carrier;
    forming a relief image on the sleeve body by imagewise jetting one or more curable jetting and curing fluids; and
    optionally overall post-curing the sleeve body.

2. The method of making a flexographic printing sleeve forme according to claim 1, wherein the step of forming the relief image includes:
    imagewise jetting a first layer of the one or more curable jetting fluids;
    performing a curing step on the first jetted layer;
    imagewise jetting a second layer of the one or more curable jetting fluids or a second layer of a second curable jetting fluid that is different from the one or more curable jetting fluids; and
    performing a curing step on the second jetted layer.

3. The method of making a flexographic printing sleeve forme according to claim 1, wherein the one or more at least partially cured layers of the sleeve body have a total thickness of from 0.2 mm to 3.0 mm.

4. The method of making a flexographic printing sleeve forme according to claim 2, wherein the one or more at least partially cured layers of the sleeve body have a total thickness of from 0.2 mm to 3.0 mm.

5. The method of making a flexographic printing sleeve forme according to claim 4, wherein the total thickness is from 0.4 mm to 1.2 mm.

6. The method of making a flexographic printing sleeve forme according to claim 1, wherein the curable composition used to form the one or more at least partially cured layers of the sleeve body includes at least one urethane(meth)acrylate oligomer, at least one (meth)acrylate monomer, and at least one photo-initiator system.

7. The method of making a flexographic printing sleeve forme according to claim 6, wherein the curable composition further includes a silicone acrylate and/or an inhibitor.

8. The method of making a flexographic printing sleeve forme according to claim 2, wherein the curable composition used to form the one or more at least partially cured layers of the sleeve body includes at least one urethane(meth)acrylate oligomer, at least one (meth)acrylate monomer, and at least one photo-initiator system.

9. The method of making a flexographic printing sleeve forme according to claim 8, wherein the curable composition further includes a silicone acrylate and/or an inhibitor.

10. The method of making a flexographic printing sleeve forme according to claim 1, wherein at least two of the at least partially cured layers of the sleeve body have a different composition.

11. The method of making a flexographic printing sleeve forme according to claim 2, wherein at least two of the at least partially cured layers of the sleeve body have a different composition.

12. The method of making a flexographic printing sleeve forme according claim 1, wherein the one or more curable jetting fluids includes at least one monofunctional monomer, at least one polyfunctional monomer or oligomer, at least one photo-initiator, and optionally a plasticizer.

13. The method of making a flexographic printing sleeve forme according claim 2, wherein the one or more curable jetting fluids includes at least one monofunctional monomer, at least one polyfunctional monomer or oligomer, at least one photo-initiator, and optionally a plasticizer.

14. The method of making a flexographic printing sleeve forme according to claim 2, wherein the relief image is formed by imagewise jetting at least the first layer of the one or more curable jetting fluids and the second layer of the second curable jetting fluid that is different from the one or more curable jetting fluids.

15. A method of flexographic printing comprising the steps of:
   providing a flexographic printing sleeve forme prepared according to claim 1;
   mounting the printing sleeve forme on a flexographic printing press;
   supplying ink to the mounted printing sleeve forme; and
   transferring the supplied ink onto a substrate.

16. A method of flexographic printing comprising the steps of:
   providing a flexographic printing sleeve forme prepared according to claim 2;
   mounting the printing sleeve forme on a flexographic printing press;
   supplying ink to the mounted printing sleeve forme; and
   transferring the supplied ink onto a substrate.

17. A method of flexographic printing comprising the steps of:
   providing a flexographic printing sleeve forme prepared according to claim 4;
   mounting the printing sleeve forme on a flexographic printing press;
   supplying ink to the mounted printing sleeve forme; and
   transferring the supplied ink onto a substrate.

18. A method of flexographic printing comprising the steps of:
   providing a flexographic printing sleeve forme prepared according to claim 8;
   mounting the printing sleeve forme on a flexographic printing press;
   supplying ink to the mounted printing sleeve forme; and
   transferring the supplied ink onto a substrate.

19. A method of flexographic printing comprising the steps of:
   providing a flexographic printing sleeve forme prepared according to claim 9;
   mounting the printing sleeve forme on a flexographic printing press;
   supplying ink to the mounted printing sleeve forme; and
   transferring the supplied ink onto a substrate.

* * * * *